(12) United States Patent
Wang et al.

(10) Patent No.: US 11,348,971 B2
(45) Date of Patent: May 31, 2022

(54) MULTILAYERED SEED FOR PERPENDICULAR MAGNETIC STRUCTURE

(71) Applicant: Avalanche Technology, Inc., Fremont, CA (US)

(72) Inventors: Zihui Wang, Mountain View, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 17/175,663

(22) Filed: Feb. 13, 2021

(65) Prior Publication Data

US 2021/0167126 A1 Jun. 3, 2021

Related U.S. Application Data

(63) Continuation of application No. 16/903,172, filed on Jun. 16, 2020, now Pat. No. 10,950,659, which is a
(Continued)

(51) Int. Cl.
*H01L 27/22* (2006.01)
*H01L 43/10* (2006.01)
(Continued)

(52) U.S. Cl.
CPC .......... *H01L 27/226* (2013.01); *G11C 11/161* (2013.01); *H01L 43/02* (2013.01);
(Continued)

(58) Field of Classification Search
CPC ..... H01L 27/22; H01L 27/226; H01L 27/228; H01L 27/222; H01L 27/2418; H01L 27/3288; H01L 41/06; H01L 41/12; H01L 41/20; H01L 41/125; H01L 43/00; H01L 43/02; H01L 43/08; H01L 43/10;
(Continued)

(56) References Cited

U.S. PATENT DOCUMENTS 5,701,223 A 12/1997 Fontana et al.
6,473,337 B1 10/2002 Tran et al.
(Continued)

*Primary Examiner* — Chuong A Luu
(74) *Attorney, Agent, or Firm* — Bing K. Yen

(57) ABSTRACT

The present invention is directed to a perpendicular magnetic structure comprising a first seed layer including tantalum, a second seed layer deposited on top of the first seed layer and including iridium, a third seed layer deposited on top of the second seed layer, and a fourth seed layer deposited on top of the third seed layer and including chromium. The third seed layer includes one of NiFe, NiFeB, NiFeCr, CoFeB, CoFeTa, CoFeW, CoFeMo, CoFeTaB, CoFeWB, or CoFeMoB. The perpendicular magnetic structure further includes a magnetic fixed layer structure formed on top of the fourth seed layer and having an invariable magnetization direction substantially perpendicular to a layer plane of the magnetic fixed layer structure. The magnetic fixed layer structure includes layers of a magnetic material interleaved with layers of a transition metal. The magnetic material includes cobalt. The transition metal includes one of nickel, platinum, palladium, or iridium.

20 Claims, 15 Drawing Sheets

Related U.S. Application Data continuation of application No. 16/595,120, filed on Oct. 7, 2019, now Pat. No. 10,720,469, which is a continuation of application No. 16/287,987, filed on Feb. 27, 2019, now Pat. No. 10,438,997, which is a continuation-in-part of application No. 16/101,325, filed on Aug. 10, 2018, now Pat. No. 10,347,691, which is a continuation-in-part of application No. 15/687,258, filed on Aug. 25, 2017, now Pat. No. 10,050,083, which is a continuation-in-part of application No. 15/491,220, filed on Apr. 19, 2017, now Pat. No. 10,008,663, and a continuation-in-part of application No. 15/295,002, filed on Oct. 17, 2016, now Pat. No. 9,793,319, which is a continuation of application No. 14/687,161, filed on Apr. 15, 2015, now Pat. No. 9,496,489.

(60) Provisional application No. 62/001,554, filed on May 21, 2014.

(51) Int. Cl.
   *H01L 43/02* (2006.01)
   *H01L 43/08* (2006.01)
   *G11C 11/16* (2006.01)

(52) U.S. Cl.
   CPC .............. *H01L 43/08* (2013.01); *H01L 43/10* (2013.01); *H01L 27/228* (2013.01)

(58) Field of Classification Search
   CPC ......... H01L 43/12; H01L 29/82; G11C 11/14; G11C 11/16; G11C 11/161; G11C 11/5607; G11C 11/1697; G11C 2211/5615; G11C 2211/5616; G11C 14/0036; G11C 14/0045; G11C 14/0081; G11C 19/02; G11C 19/10; G11C 19/14; H01F 10/329; H01F 10/324; H01F 10/3295; H01F 10/3286; H01F 41/303; B82Y 10/00; B82Y 25/00
   USPC ........................................................ 257/421
   See application file for complete search history.

(56) References Cited

U.S. PATENT DOCUMENTS

| | | |
|---|---|---|
| 6,849,465 B2 | 2/2005 | Park et al. |
| 7,696,551 B2 | 4/2010 | Xiao et al. |
| 8,184,411 B2 | 5/2012 | Zhang et al. |
| 8,541,855 B2 | 9/2013 | Jan et al. |
| 9,490,054 B2 | 11/2016 | Jan et al. |
| 2003/0200927 A1* | 10/2003 | Watanabe ............. C23C 14/352 |
| 2003/0232218 A1* | 12/2003 | Sato ........................ G11B 5/66 |
| 2005/0041463 A1 | 2/2005 | Drewes |
| 2005/0079638 A1 | 4/2005 | Drewes et al. |
| 2005/0185455 A1 | 8/2005 | Huai |
| 2006/0061915 A1 | 3/2006 | Zhang et al. |
| 2007/0264728 A1 | 11/2007 | Miura et al. |
| 2007/0297220 A1 | 12/2007 | Yoshikawa et al. |
| 2008/0246104 A1 | 10/2008 | Ranjan et al. |
| 2008/0261082 A1 | 10/2008 | Nishimura et al. |
| 2009/0213642 A1 | 8/2009 | Raberg et al. |
| 2010/0315863 A1 | 12/2010 | Zhu et al. |
| 2011/0064969 A1 | 3/2011 | Chen et al. |
| 2011/0293967 A1 | 12/2011 | Zhang et al. |
| 2012/0126905 A1 | 5/2012 | Zhang et al. |
| 2013/0009260 A1 | 1/2013 | Apalkov et al. |
| 2014/0103469 A1 | 4/2014 | Jan et al. |
| 2014/0153324 A1 | 6/2014 | Yu |
| 2015/0008550 A1 | 1/2015 | Min et al. |

* cited by examiner

MULTILAYERED SEED FOR PERPENDICULAR MAGNETIC STRUCTURE

CROSS-REFERENCE TO RELATED APPLICATIONS

The present application is a continuation of the commonly assigned application bearing Ser. No. 16/903,172 filed on Jun. 16, 2020, entitled "Multilayered Seed for Perpendicular Magnetic Structure," which is a continuation of the commonly assigned application bearing Ser. No. 16/595,120 filed on Oct. 7, 2019, entitled "Multilayered Seed Structure for Magnetic Memory Element Including a CoFeB Seed Layer," which is a continuation of the commonly assigned application bearing Ser. No. 16/287,987 filed on Feb. 27, 2019, entitled "Multilayered Seed Structure for Magnetic Memory Element Including a CoFeB Seed Layer," which is a continuation-in-part of the commonly assigned application bearing Ser. No. 16/101,325 filed on Aug. 10, 2018, entitled "Magnetic Memory Element with Multilayered Seed," which is a continuation-in-part of the commonly assigned application bearing Ser. No. 15/687,258 filed on Aug. 25, 2017, entitled "Magnetic Structure with Multilayered Seed," which is a continuation-in-part of the commonly assigned application bearing Ser. No. 15/491,220 filed on Apr. 19, 2017, entitled "Perpendicular Magnetic Fixed Layer with High Anisotropy," and a continuation-in-part of the commonly assigned application bearing Ser. No. 15/295,002 filed on Oct. 17, 2016, entitled "Magnetic Random Access Memory with Multilayered Seed Structure," which is a continuation of the commonly assigned application bearing Ser. No. 14/687,161 filed on Apr. 15, 2015, entitled "Magnetic Random Access Memory with Multilayered Seed Structure," which claims the benefit of the provisional application bearing Ser. No. 62/001,554 filed on May 21, 2014, entitled "Magnetic Random Access Memory with Multilayered Seed Structure." All of these applications are incorporated herein by reference in their entirety, including their specifications and drawings.

BACKGROUND

The present invention relates to a magnetic random access memory (MRAM) device, and more particularly, to a magnetic memory element including multiple magnetic layers having magnetization directions perpendicular to layer planes thereof.

Spin transfer torque magnetic random access memory (STT-MRAM) is a new class of non-volatile memory, which can retain the stored information when powered off. An STT-MRAM device normally comprises an array of memory cells, each of which includes at least a magnetic memory element and a selection element coupled in series between appropriate electrodes. Upon application of a switching current to the magnetic memory element, the electrical resistance of the magnetic memory element would change accordingly, thereby switching the stored logic in the respective memory cell.

FIG. 1 shows a conventional memory element for an STT-MRAM device comprising a magnetic reference layer 50 and a magnetic free layer 52 with an insulating tunnel junction layer 54 interposed therebetween, thereby collectively forming a magnetic tunnel junction (MTJ) 56. The magnetic reference layer 50 and free layer 52 have magnetization directions 58 and 60, respectively, which are substantially perpendicular to the layer planes. Therefore, the MTJ 56 is a perpendicular type comprising the magnetic layers 50 and 52 with perpendicular anisotropy. Upon application of a switching current to the perpendicular MTJ 56, the magnetization direction 60 of the magnetic free layer 52 can be switched between two directions: parallel and anti-parallel with respect to the magnetization direction 58 of the magnetic reference layer 50. The insulating tunnel junction layer 54 is normally made of a dielectric material with a thickness ranging from a few to a few tens of angstroms. When the magnetization directions 60 and 58 of the magnetic free layer 52 and reference layer 50 are substantially parallel (i.e., same direction), electrons polarized by the magnetic reference layer 50 can tunnel through the insulating tunnel junction layer 54, thereby decreasing the electrical resistance of the perpendicular MTJ 56. Conversely, the electrical resistance of the perpendicular MTJ 56 is high when the magnetization directions 58 and 60 of the magnetic reference layer 50 and free layer 52 are substantially anti-parallel (i.e., opposite directions). Accordingly, the stored logic in the magnetic memory element can be switched by changing the magnetization direction 60 of the magnetic free layer 52.

One of many advantages of STT-MRAM over other types of non-volatile memories is scalability. As the size of the perpendicular MTJ 56 is reduced, however, the thermal stability of the magnetic layers 50 and 52, which is required for long term data retention, also degrades with miniaturization of the perpendicular MTJ 56. While the thermal stability of the perpendicular MTJ 56 may be improved by increasing the coercivity of the magnetic free layer 52, doing so may adversely increase the current required to switch the magnetization direction 60 of the magnetic free layer 52.

For the foregoing reasons, there is a need for an MRAM device that has a thermally stable perpendicular MTJ memory element which can be programmed with a low switching current.

SUMMARY

The present invention is directed to a memory element that satisfies this need. An MTJ memory element having features of the present invention comprises a magnetic free layer structure including one or more magnetic free layers that have a same variable magnetization direction substantially perpendicular to layer planes thereof; an insulating tunnel junction layer formed adjacent to the magnetic free layer structure; a magnetic reference layer structure formed adjacent to the insulating tunnel junction layer opposite the magnetic free layer structure, the magnetic reference layer structure including one or more magnetic reference layers that have a first invariable magnetization direction substantially perpendicular to layer planes thereof; an anti-ferromagnetic coupling layer formed adjacent to the magnetic reference layer structure opposite the insulating tunnel junction layer; a magnetic fixed layer structure formed adjacent to the anti-ferromagnetic coupling layer opposite the magnetic reference layer structure, the magnetic fixed layer structure having a second invariable magnetization direction that is substantially perpendicular to a layer plane thereof and is substantially opposite to the first invariable magnetization direction; and a seed layer structure that may include a first seed layer formed adjacent to the magnetic fixed layer structure and a second seed layer. The magnetic fixed layer structure includes layers of a first type material interleaved with layers of a second type material with at least one of the first and second type materials being magnetic. The first seed layer may include one or more layers of nickel interleaved with one or more layers of a first transition metal, which may be tantalum, titanium, or vanadium. The second seed layer may be made of an alloy or compound comprising nickel and a second transition metal, which may be chromium, tantalum, or titanium. Alternatively, the first seed layer may be made of chromium or iridium and the second seed layer may comprise cobalt, iron, and boron.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Figure 1:
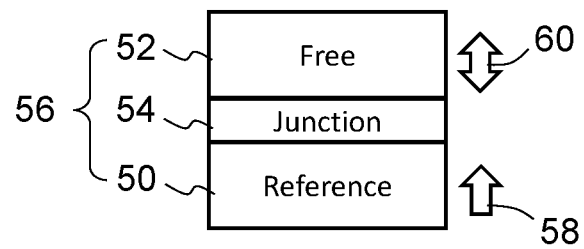
FIG. 1 is a cross-sectional view of a conventional magnetic tunnel junction.

In the Summary above and in the Detailed Description, and the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "superlattice" means a synthetic periodic structure formed by interleaving layers of at least two constituent materials. A superlattice has at least two repeated unit stacks with each unit stack formed by laminating the constituent materials. Because of the periodic nature of its structure, a superlattice may exhibit characteristic satellite peaks when analyzed by diffraction methods, such as X-ray diffraction and neutron diffraction. For example, a [Co/Pt]n superlattice would denote a structure formed by n stacks of the bilayer structure of cobalt (Co) and platinum (Pt).

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "a first number to a second number" or "a first number-a second number," this means a range whose lower limit is the first number and whose upper limit is the second number. For example, "25 to 100 nm" means a range whose lower limit is 25 nm and whose upper limit is 100 nm.

Figure 2:
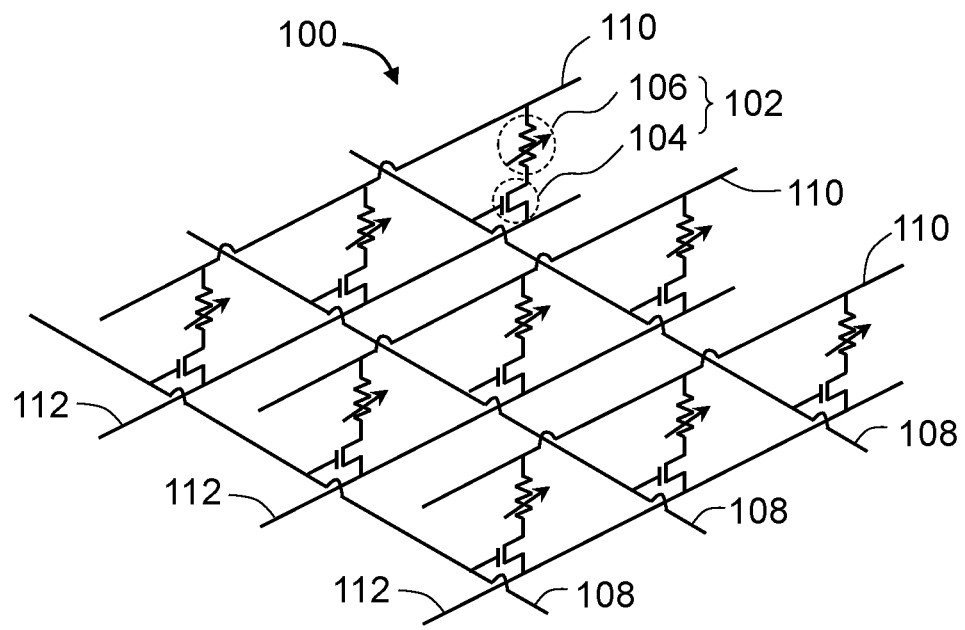
FIG. 2 is a schematic circuit diagram of an MRAM array in accordance with an embodiment of the present invention.

FIG. 2 is a schematic circuit diagram of an MRAM array 100 in accordance with an embodiment of the present invention. The MRAM array 100 comprises a plurality of memory cells 102, each of the memory cells 102 including a selection transistor 104 coupled to an MTJ memory element 106; a plurality of parallel word lines 108 with each being coupled to gates of a respective row of the selection transistors 104 in a first direction; and a plurality of parallel bit lines 110 with each being coupled to a respective row of the MTJ memory elements 106 in a second direction substantially perpendicular to the first direction; and a plurality of parallel source lines 112 with each being coupled to sources or drains of a respective row of the selection transistors 104 in the second direction. The MTJ memory element 106 has a perpendicular MTJ structure that includes multiple magnetic layers having magnetization directions substantially perpendicular to layer planes thereof.

Figure 3:
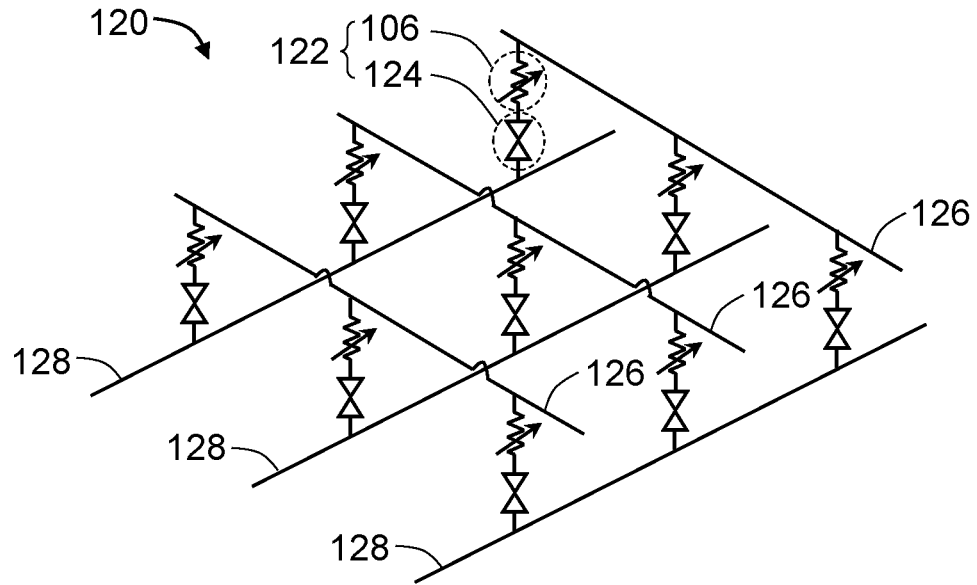
FIG. 3 is a schematic circuit diagram of an MRAM array in accordance with another embodiment of the present invention.
Figure 4:
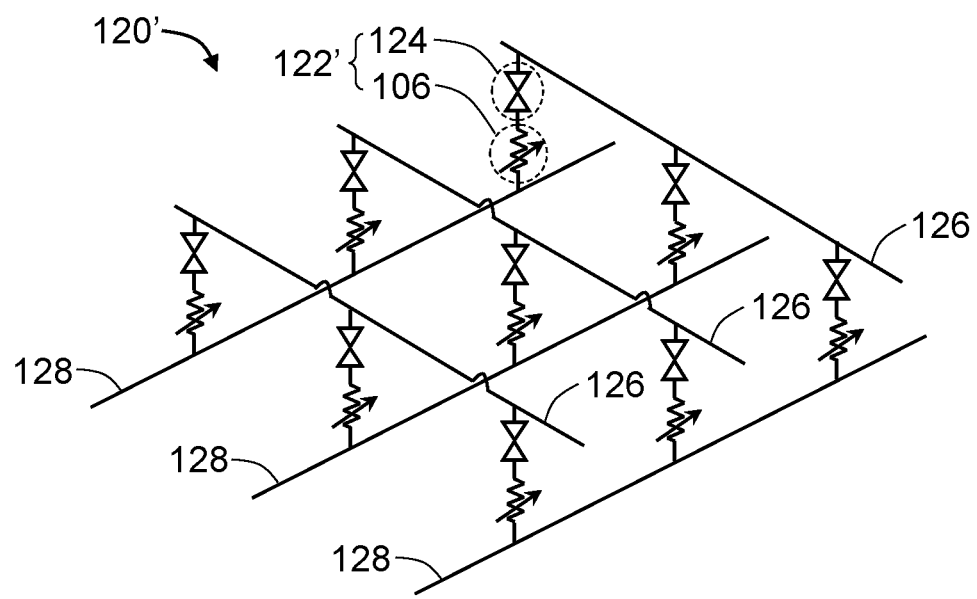
FIG. 4 is a schematic circuit diagram of an MRAM array in accordance with still another embodiment of the present invention.

FIG. 3 is a schematic circuit diagram of an MRAM array 120 in accordance with another embodiment of the present invention. The MRAM array 120 comprises a plurality of memory cells 122 with each of the memory cells 122 including a two-terminal selector 124 coupled to an MTJ memory element 106 in series; a first plurality of parallel wiring lines 126 with each being coupled to a respective row of the MTJ memory elements 106 in a first direction; and a second plurality of parallel wiring lines 128 with each being coupled to a respective row of the selectors 124 in a second direction substantially perpendicular to the first direction. Accordingly, the memory cells 122 are located at the cross points between the first and second plurality of wiring lines 126 and 128. The first and second plurality of wiring lines 126 and 128 may be word lines and bit lines, respectively, or vice versa. The MTJ memory element 106 may have a perpendicular MTJ structure that includes multiple magnetic layers having magnetizations directions substantially perpendicular to layer planes thereof. Multiple layers of the memory array 120 may be stacked to form a monolithic three-dimensional memory device. While the MTJ memory element 106 is shown to form above the two-terminal selector 124 in FIG. 3, the stacking order of the MTJ memory element 106 and the selector 124 may reversed as illustrated in FIG. 4.

Figure 5A:
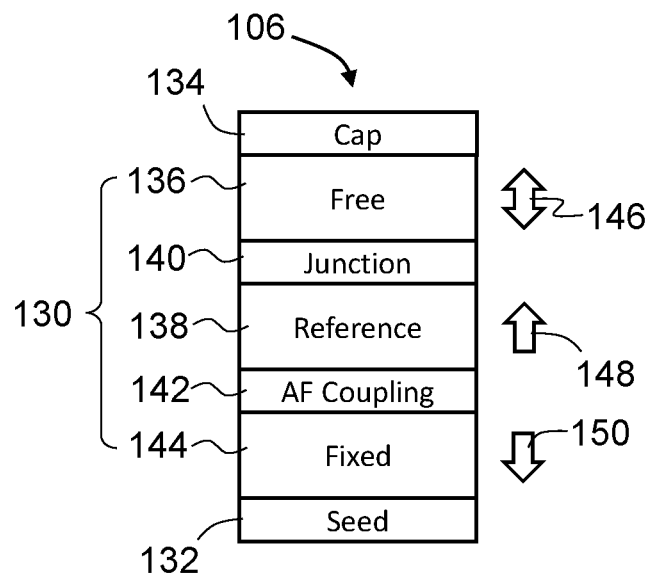
FIGS. 5A and 5B are cross-sectional views of MTJ memory elements in accordance with embodiments of the present invention.

An embodiment of the present invention as applied to the MTJ memory element 106 will now be described with reference to FIG. 5A. Referring now to FIG. 5A, the exemplary magnetic structure for the MTJ memory element 106 includes a magnetic tunnel junction (MTJ) structure 130 in between a seed layer structure 132 and a cap layer structure 134. The MTJ structure 130 comprises a magnetic free layer structure 136 and a magnetic reference layer structure 138 with an insulating tunnel junction layer 140 interposed therebetween, an anti-ferromagnetic coupling layer 142 formed adjacent to the magnetic reference layer structure 138 opposite the insulating tunnel junction layer 140, and a magnetic fixed layer structure 144 formed adjacent to the anti-ferromagnetic coupling layer 142 opposite the magnetic reference layer structure 138. Therefore, the magnetic fixed layer structure 144 is anti-ferromagnetically exchange coupled to the magnetic reference layer structure 138 via the anti-ferromagnetic coupling layer 142. The magnetic fixed layer structure 144 and the magnetic free layer structure 136 may be formed adjacent to the seed layer structure 132 and cap layer structure 134, respectively. Additional layers, magnetic or non-magnetic, may form between the magnetic fixed layer structure 144 and the seed layer structure 132 and/or between the magnetic free layer structure 136 and the cap layer structure 134.

The magnetic free layer structure 136 has a variable magnetization direction 146 substantially perpendicular to a layer plane thereof. The magnetic reference layer structure 138 has a first invariable magnetization direction 148 substantially perpendicular to a layer plane thereof. The magnetic fixed layer structure 144 has a second invariable magnetization direction 150 that is substantially perpendicular to a layer plane thereof and is substantially opposite to the first invariable magnetization direction 148.

Figure 5B:
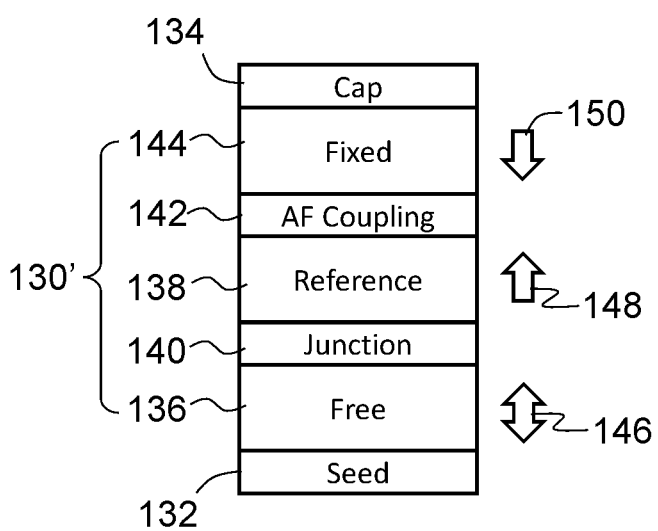

The stacking order of the layers 136-144 in the MTJ structure 130 of the exemplary structure of the memory element 106 may be inverted as illustrated in FIG. 5B. The exemplary structure of FIG. 5B includes an MTJ structure 130' that has the same layers but with the inverted stacking order comparing to the MTJ structure 130. Accordingly, the magnetic free layer structure 136 and the magnetic fixed layer structure 144 may be formed adjacent to the seed layer structure 132 and cap layer structure 134, respectively.

Figure 6A:
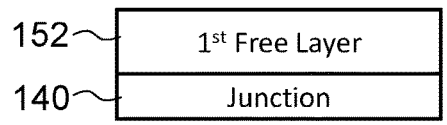
FIGS. 6A-6G are cross-sectional views of exemplary magnetic free layer structures in accordance with embodiments of the present invention.

The magnetic free layer structure 136 may include one or more magnetic layers with each layer having the variable magnetization direction 146 as illustrated by the exemplary embodiments shown in FIGS. 6A-6G. FIG. 6A shows that the magnetic free layer structure 136 includes a first magnetic free layer 152, which has the variable magnetization direction 146, formed adjacent to the tunnel junction layer 140.

Figure 6B:

FIG. 6B shows the magnetic free layer structure 136 including a first magnetic free layer 152 formed adjacent to the tunnel junction layer 140 and a second magnetic free layer 154 formed adjacent to the first magnetic free layer 152 opposite the tunnel junction layer 140. Each of the first and second magnetic free layers 152 and 154 has the variable magnetization direction 146. The exemplary magnetic free layer structure of FIG. 6B may further include a non-magnetic perpendicular enhancement layer (PEL) 158 interposed between the first and second magnetic free layers 152 and 154 as illustrated in FIG. 6D.

Figure 6C:
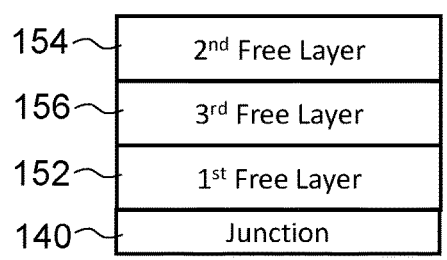
Figure 6D:
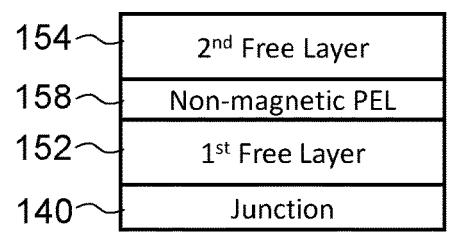

The magnetic free layer structure 136 may include three magnetic free layers 152-156 as illustrated in FIG. 6C. A first magnetic free layer 152 is formed adjacent to the tunnel junction layer 140. A third magnetic free layer 156 is formed adjacent to the first magnetic free layer 152 opposite the tunnel junction layer 140. A second magnetic free layer 154 is formed adjacent to the third magnetic free layer 156 opposite the first magnetic free layer 152. Each of the first, second, and third magnetic free layers 152-156 has the variable magnetization direction 146.

Figure 6E:
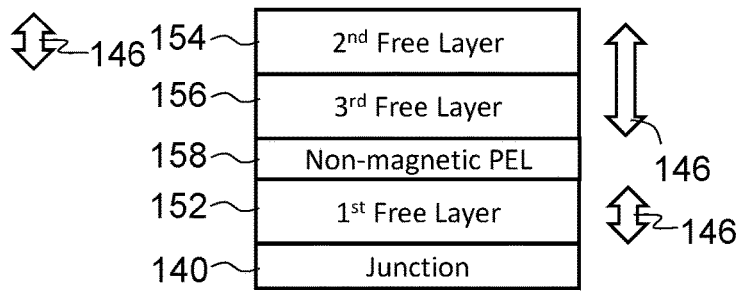
Figure 6F:
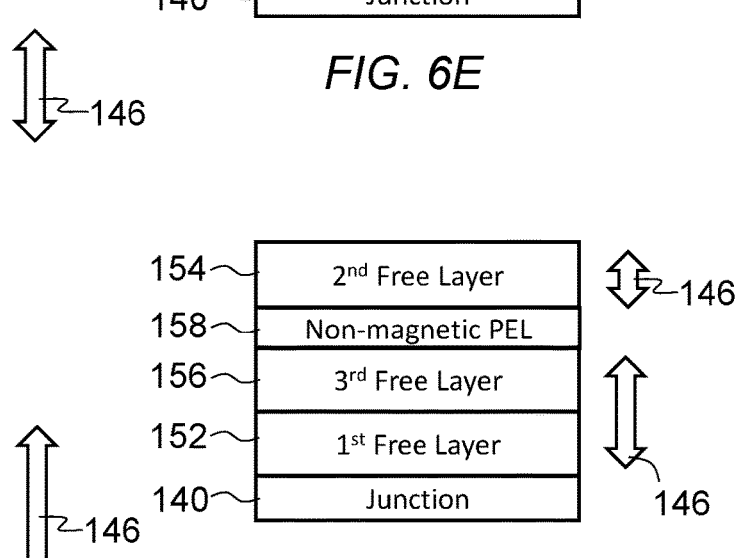
Figure 6G:
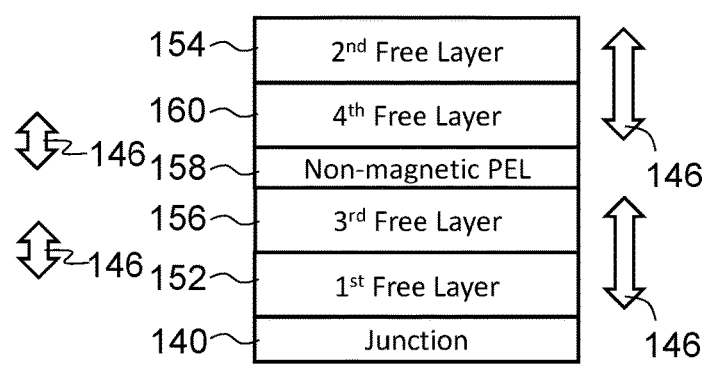

The exemplary magnetic free layer structure of FIG. 6C may further include a non-magnetic perpendicular enhancement layer (PEL) 158 interposed between the first and third magnetic free layers 152 and 156 as illustrated in FIG. 6E. Alternatively, the exemplary magnetic free layer structure of FIG. 6C may further include a non-magnetic perpendicular enhancement layer (PEL) 158 interposed between the second and third magnetic free layers 154 and 156 as illustrated in FIG. 6F. The exemplary magnetic free layer structure of FIG. 6F may be further modified to include a fourth magnetic free layer 160, which has the variable magnetization direction 146, interposed between the non-magnetic PEL 158 and the second magnetic free layer 154 as illustrated in FIG. 6G.

The exemplary magnetic free layer structures of FIGS. 6A-6G may be formed above the tunnel junction layer 140 as shown in FIG. 5A, or beneath the tunnel junction layer 140 as shown in FIG. 5B. In the latter case, the stacking sequence of the layers in the exemplary magnetic free layer structures of FIGS. 6A-6G will be inverted.

The magnetic free layer structure 136 is not limited to the exemplary structures of FIGS. 6A-6G and may have other structures that include multiple magnetic free layers and optionally one or more PELs. For example, the magnetic free layer structure 136 may include four magnetic free layers in contiguous contact without any PEL.

Figure 7A:
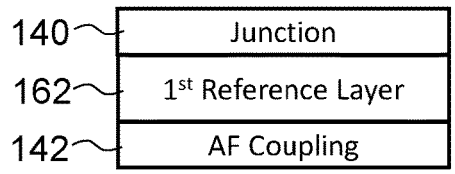
FIGS. 7A-7G are cross-sectional views of exemplary magnetic reference layer structures in accordance with embodiments of the present invention.

The magnetic reference layer structure 138 may include one or more magnetic layers with each layer having the first invariable magnetization direction 148 as illustrated by the exemplary embodiments shown in FIGS. 7A-7G. FIG. 7A shows that the magnetic reference layer structure 138 includes a first magnetic reference layer 162, which has the first invariable magnetization direction 148, formed between the tunnel junction layer 140 and the anti-ferromagnetic coupling layer 142.

Figure 7B:
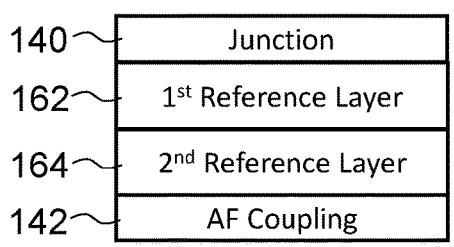

FIG. 7B shows the magnetic reference layer structure 138 including a first magnetic reference layer 162 formed adjacent to the tunnel junction layer 140 and a second magnetic reference layer 164 formed adjacent to the first magnetic reference layer 162 opposite the tunnel junction layer 140. The anti-ferromagnetic coupling layer 142 is formed adjacent to the second magnetic reference layer 164 opposite the first magnetic reference layer 162. Each of the first and second magnetic reference layers 162 and 164 has the first invariable magnetization direction 148. The exemplary magnetic reference layer structure of FIG. 7B may further include a non-magnetic perpendicular enhancement layer (PEL) 168 interposed between the first and second magnetic reference layers 162 and 164 as illustrated in FIG. 7D.

Figure 7C:
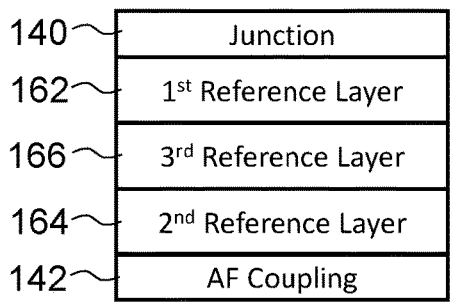
Figure 7D:
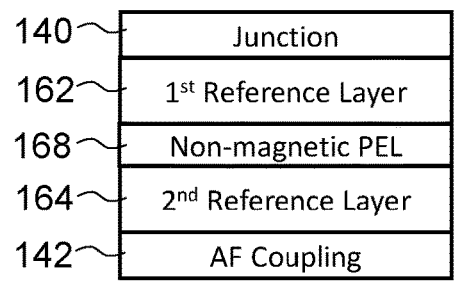

The magnetic reference layer structure 138 may include three magnetic reference layers 162-166 as illustrated in FIG. 7C. A first magnetic reference layer 162 is formed adjacent to the tunnel junction layer 140. A third magnetic reference layer 166 is formed adjacent to the first magnetic reference layer 162 opposite the tunnel junction layer 140. A second magnetic reference layer 164 is formed adjacent to the third magnetic reference layer 166 opposite the first magnetic reference layer 162. The anti-ferromagnetic coupling layer 142 is formed adjacent to the second magnetic reference layer 164 opposite the third magnetic reference layer 166. Each of the first, second, and third magnetic reference layers 162-166 has the first invariable magnetization direction 148.

Figure 7E:
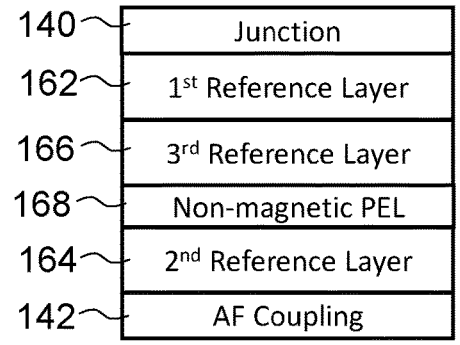
Figure 7F:
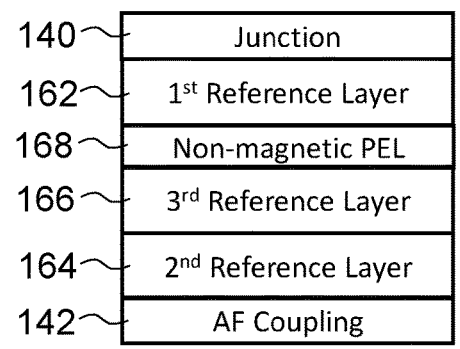
Figure 7G:
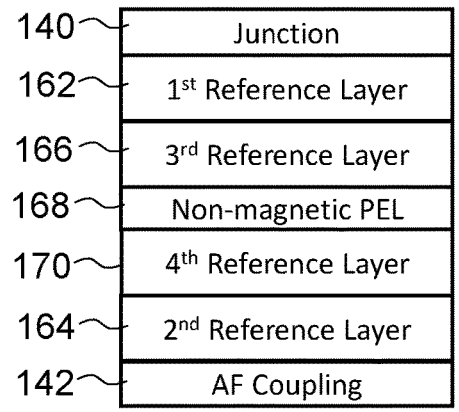

The exemplary magnetic reference layer structure of FIG. 7C may further include a non-magnetic perpendicular enhancement layer (PEL) 168 interposed between the first and third magnetic reference layers 162 and 166 as illustrated in FIG. 7F. Alternatively, the exemplary magnetic reference layer structure of FIG. 7C may further include a non-magnetic perpendicular enhancement layer (PEL) 168 interposed between the second and third magnetic reference layers 164 and 166 as illustrated in FIG. 7E. The exemplary magnetic reference layer structure of FIG. 7E may be further modified to include a fourth magnetic reference layer 170, which has the first invariable magnetization direction 148, interposed between the non-magnetic PEL 168 and the second magnetic reference layer 164 as illustrated in FIG. 7G.

The exemplary magnetic reference layer structures of FIGS. 7A-7G may be formed beneath the tunnel junction layer 140 as shown in FIG. 5A, or above the tunnel junction layer 140 as shown in FIG. 5B. In the latter case, the stacking sequence of the layers in the exemplary magnetic reference layer structures of FIGS. 7A-7G will be inverted.

The magnetic reference layer structure 138 is not limited to the exemplary structures of FIGS. 7A-7G and may have other structures that include multiple magnetic reference layers and optionally one or more PELs. For example, the magnetic reference layer structure 138 may include four magnetic reference layers in contiguous contact without any PEL.

Figure 8A:
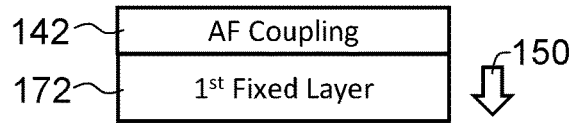
FIGS. 8A-8G are cross-sectional views of exemplary magnetic fixed layer structures in accordance with embodiments of the present invention.

The magnetic fixed layer structure 144 may include one or more magnetic layers with each layer having the second invariable magnetization direction 150 as illustrated by the exemplary embodiments shown in FIGS. 8A-8G. FIG. 8A shows that the magnetic fixed layer structure 144 includes a first magnetic fixed layer 172, which has the second invariable magnetization direction 150, formed adjacent to the anti-ferromagnetic coupling layer 142.

Figure 8E:
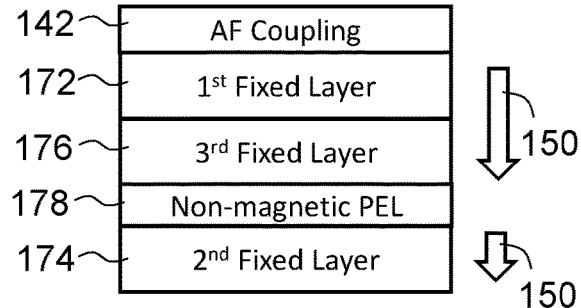
Figure 8B:
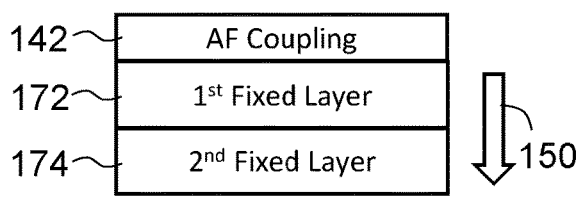
Figure 8F:
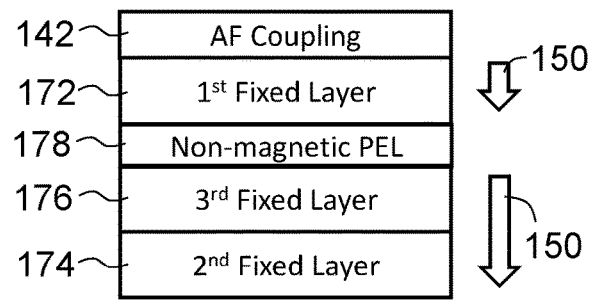

FIG. 8B shows the magnetic fixed layer structure 144 including a first magnetic fixed layer 172 formed adjacent to the anti-ferromagnetic coupling layer 142 and a second magnetic fixed layer 174 formed adjacent to the first magnetic fixed layer 172 opposite the anti-ferromagnetic coupling layer 142. Each of the first and second magnetic fixed layers 172 and 174 has the second invariable magnetization direction 150. The exemplary magnetic fixed layer structure of FIG. 8B may further include a non-magnetic perpendicular enhancement layer (PEL) 178 interposed between the first and second magnetic fixed layers 172 and 174 as illustrated in FIG. 8D.

Figure 8C:
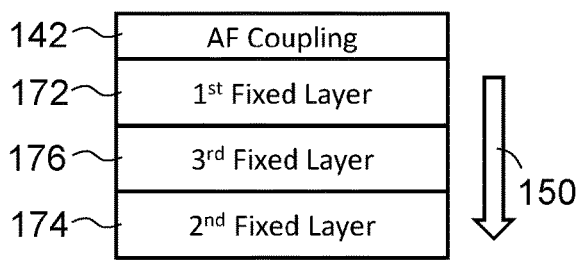

The magnetic fixed layer structure 144 may include three magnetic fixed layers 172-176 as illustrated in FIG. 8C. A first magnetic fixed layer 172 is formed adjacent to the anti-ferromagnetic coupling layer 142. A third magnetic fixed layer 176 is formed adjacent to the first magnetic fixed layer 172 opposite the anti-ferromagnetic coupling layer 142. A second magnetic fixed layer 174 is formed adjacent to the third magnetic fixed layer 176 opposite the first magnetic fixed layer 172. Each of the first, second, and third magnetic fixed layers 172-176 has the second invariable magnetization direction 150.

Figure 8G:
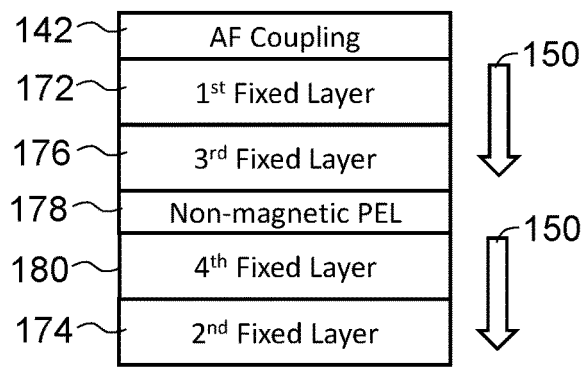
Figure 8D:
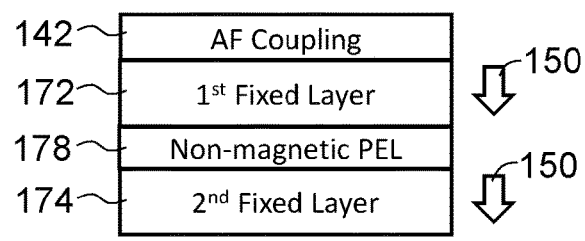

The exemplary magnetic fixed layer structure of FIG. 8C may further include a non-magnetic perpendicular enhancement layer (PEL) 178 interposed between the first and third magnetic fixed layers 172 and 176 as illustrated in FIG. 8F. Alternatively, the exemplary magnetic fixed layer structure of FIG. 8C may further include a non-magnetic perpendicular enhancement layer (PEL) 178 interposed between the second and third magnetic fixed layers 174 and 176 as illustrated in FIG. 8E. The exemplary magnetic fixed layer structure of FIG. 8E may be further modified to include a fourth magnetic fixed layer 180, which has the second invariable magnetization direction 150, interposed between the non-magnetic PEL 178 and the second magnetic fixed layer 174 as illustrated in FIG. 8G.

The exemplary magnetic fixed layer structures of FIGS. 8A-8G may be formed beneath the anti-ferromagnetic coupling layer 142 as shown in FIG. 5A, or above the anti-ferromagnetic coupling layer 142 as shown in FIG. 5B. In the latter case, the stacking sequence of the layers in the exemplary magnetic fixed layer structures of FIGS. 8A-8G will be inverted.

The magnetic fixed layer structure 144 is not limited to the exemplary structures of FIGS. 8A-8G and may have other structures that include multiple magnetic fixed layers and optionally one or more PELs. For example, the magnetic fixed layer structure 144 may include four magnetic fixed layers in contiguous contact without any PEL.

The magnetic layers 152-156, 160-166, 170-176, and 180 may be made of any suitable magnetic materials or structures. One or more of the magnetic layers 152-156, 160-166, 170-176, and 180 may comprise one or more ferromagnetic elements, such as but not limited to cobalt (Co), nickel (Ni), and iron (Fe), to form a suitable magnetic material, such as but not limited to Co, Ni, Fe, CoNi, CoFe, NiFe, or CoNiFe. The suitable magnetic material for the one or more of the magnetic layers 152-156, 160-166, 170-176, and 180 may further include one or more non-magnetic elements, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), samarium (Sm), neodymium (Nd), antimony (Sb), iridium (Ir) or phosphorus (P), to form a magnetic alloy or compound, such as but not limited to cobalt-iron-boron (CoFeB), iron-platinum (FePt), cobalt-platinum (CoPt), cobalt-platinum-chromium (CoPtCr), cobalt-iron-boron-titanium (CoFeBTi), cobalt-iron-boron-zirconium (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), iron-zirconium-boron (FeZrB), samarium-cobalt (SmCo), neodymium-iron-boron (NdFeB), cobalt-iron-antimony (CoFeSb), cobalt-iron-iridium (CoFeIr), or cobalt-iron-phosphorous (CoFeP).

Some of the above-mentioned magnetic materials, such as Fe, CoFe, CoFeB may have a body-centered cubic (BCC) lattice structure that is compatible with the halite-like cubic lattice structure of MgO, which may be used as the insulating tunnel junction layer 140. CoFeB alloy used for one or more of the magnetic layers 152-156, 160-166, 170-176, and 180 may contain more than 40 atomic percent Fe or may contain less than 40 atomic percent B or both.

Figure 9A:
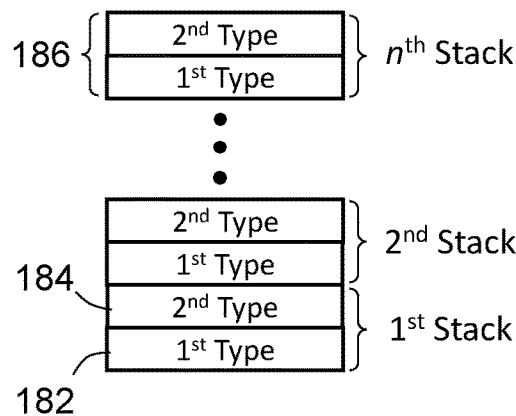
FIGS. 9A-9D are cross-sectional views of exemplary multilayer structures comprising one or more stacks of a bilayer unit structure.
Figure 9C:
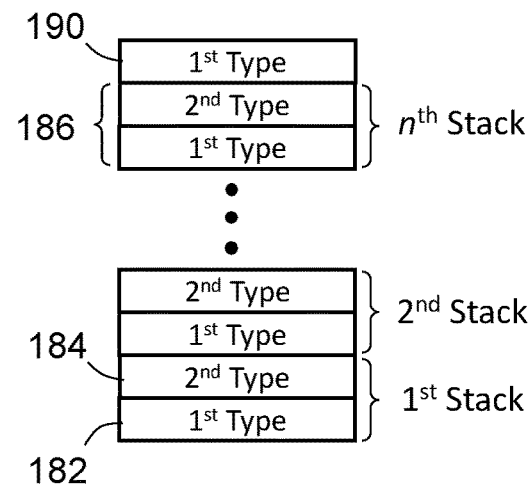
Figure 9B:
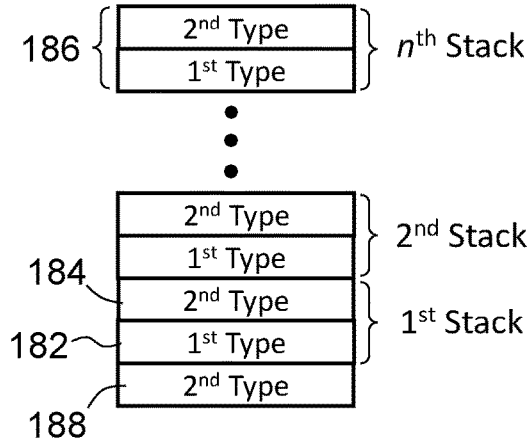
Figure 9D:
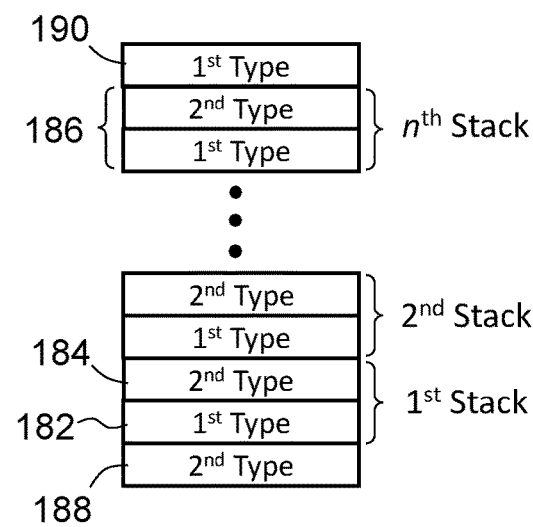

One or more of the magnetic layers 152-156, 160-166, 170-176, and 180 may alternatively have a multilayer structure formed by interleaving one or more layers of a first type of material 182 with one or more layers of a second type of material 184 with at least one of the two types of materials being magnetic, as illustrated in FIGS. 9A-9D. FIG. 9A shows an exemplary multilayer structure formed by one (n=1) or more stacks of a bilayer unit structure 186, which includes a layer of the first type of material 182 and a layer of the second type of material 184. The multilayer structure for one or more of the magnetic layers 152-156, 160-166, 170-176, and 180 may include additional layers formed at the periphery of the exemplary multilayer structure of FIG. 9A. For example, the stacks of the bilayer unit structure 186 may include another layer of the second type of material 188 formed adjacent to the first type of material of the first stack as shown in FIG. 9B, or another layer of the first type of material 190 formed adjacent to the second type of material of the $n^{th}$ stack (the end stack) as shown in FIG. 9C, or both as shown in FIG. 9D. The layer of the first type of material 182 in a stack 186 may have a different thickness compared with other layers of the first type of material in other stacks. Similarly, the layer of the second type of material 184 in a stack 186 may have a different thickness compared with other layers of the second type of material in other stacks. The layer thicknesses of the first type of material 190 and the second type of material 188 at the periphery may or may not be same as the layer thicknesses of the first type of material 182 and the second type of material 184 of the bilayer unit structure 186, respectively. One or more layers of the two layers of materials 182 and 184 may be extremely thin and thus have fragmented coverage and/or are perforated with holes. The stacking sequences of the exemplary multilayer structures of FIGS. 9A-9D may be inverted.

The first type of material 182 and 190 may comprise one or more ferromagnetic elements, such as but not limited to cobalt (Co), nickel (Ni), and iron (Fe), to form a suitable magnetic material, such as but not limited to Co, Ni, Fe, CoNi, CoFe, NiFe, or CoNiFe. The second type of material 184 and 188 may be made of any suitable material, such as but not limited to Pt, Pd, Ni, Ir, Cr, V, Ti, Zr, Hf, Nb, Ta, Mo, W, NiCr, NiV, NiTi, NiZr, NiHf, NiNb, NiTa, NiMo, NiW, or any combination thereof. Therefore, one or more of the magnetic layers 152-156, 160-166, 170-176, and 180 may include a multilayer structure, such as but not limited to [Co/Pt], [Co/Pd], [Co/Pt(Pd)], [Co/Ni], [Co/Ir], [CoFe/Pt], [CoFe/Pd], [CoFe/Pt(Pd)], [CoFe/Ni], [CoFe/Ir], [Co/NiCr], or any combination thereof. The multilayer structure may have a face-centered cubic (FCC) type of lattice structure, which is different from the body-centered cubic structure (BCC) of some ferromagnetic materials, such as Fe, CoFe, and CoFeB, and the halite-like cubic lattice structure of magnesium oxide (MgO) that may be used as the insulating tunnel junction layer 140. All individual magnetic layers of a magnetic multilayer structure may have the same magnetization direction. The multilayer structure may or may not exhibit the characteristic satellite peaks associated with superlattice when analyzed by X-ray, neutron diffraction, or other diffraction techniques.

Figure 10A:
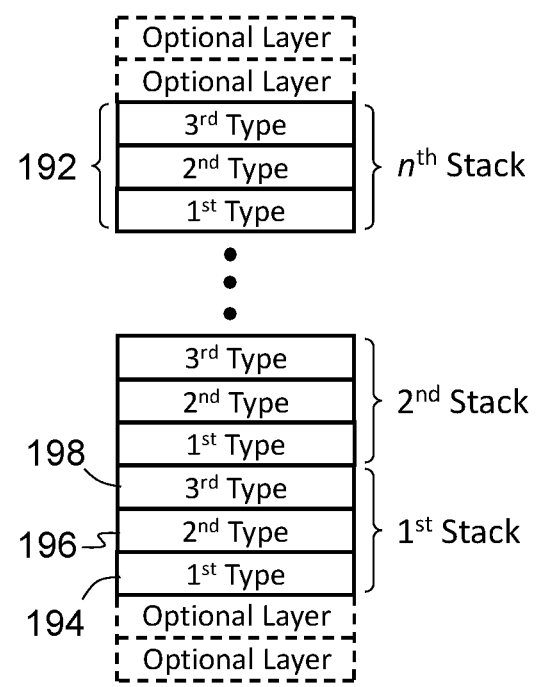
FIGS. 10A-10I are cross-sectional views of exemplary multilayer structures comprising one or more stacks of a trilayer unit structure.
Figure 10B:
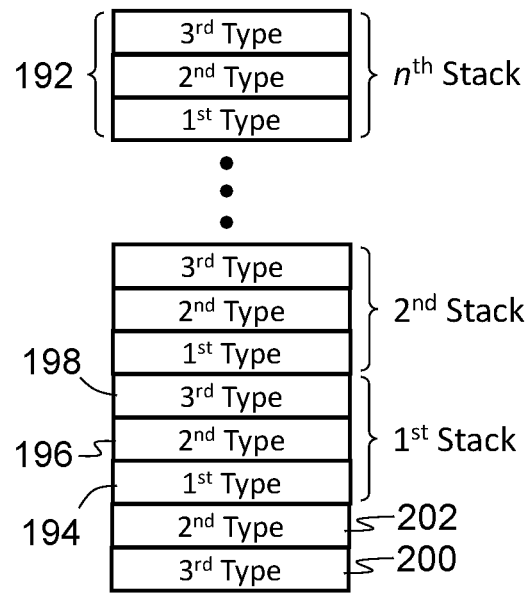
Figure 10D:
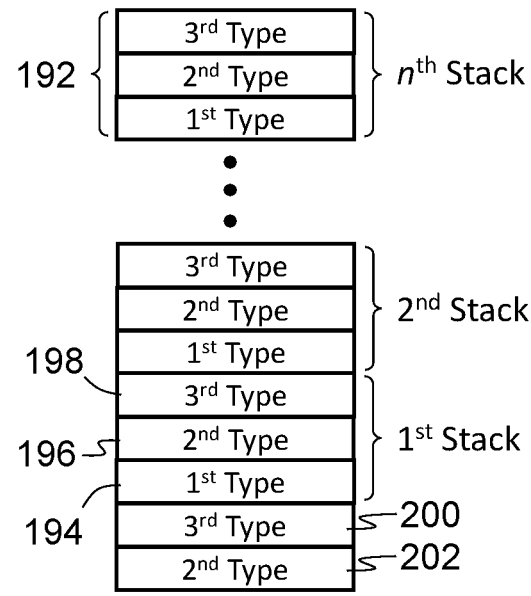
Figure 10C:
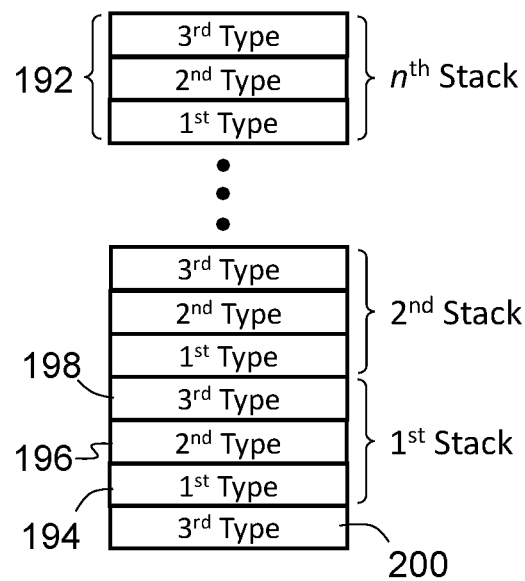
Figure 10E:
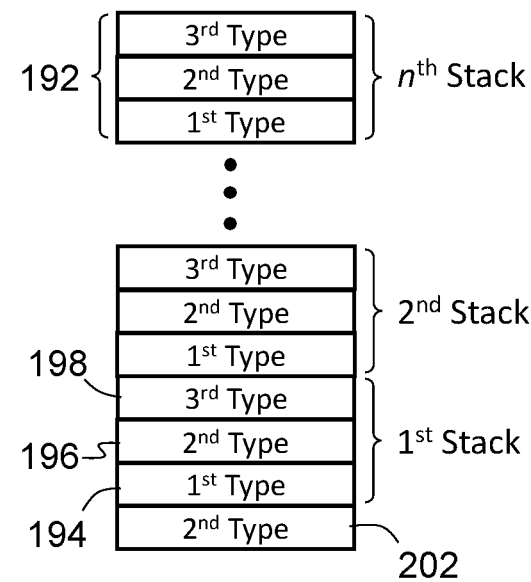

One or more of the magnetic layers 152-156, 160-166, 170-176, and 180 may alternatively have a multilayer structure formed by one (n=1) or more stacks of a trilayer unit structure 192 as illustrated in FIG. 10A. Each trilayer unit structure 192 includes a layer of a first type of material 194 and a layer of a third type of material 198 with a layer of a second type of material 196 interposed therebetween. At least one of the three types of materials 194-198 is magnetic. The multilayer structure of FIG. 10A may include one or more additional layers formed adjacent to the first stack and/or the $n^{th}$ stack thereof. FIGS. 10B-10E show some exemplary structures in which one or more additional layers are formed adjacent to the first stack. The exemplary structures of FIGS. 10C and 10E respectively show that a layer of the third type of material 200 and a layer of the second type of material 202 may form adjacent to the layer of the first type of material 194 of the first stack. The exemplary structure of FIG. 10C may further include a layer of the second type of material 202 formed adjacent to the layer of the third type of material 200 opposite the first stack as shown in FIG. 10D. Similarly, the exemplary structure of FIG. 10E may further include a layer of the third type of material 200 formed adjacent to the layer of the second type of material 202 opposite the first stack as shown in FIG. 10B.

Figure 10F:
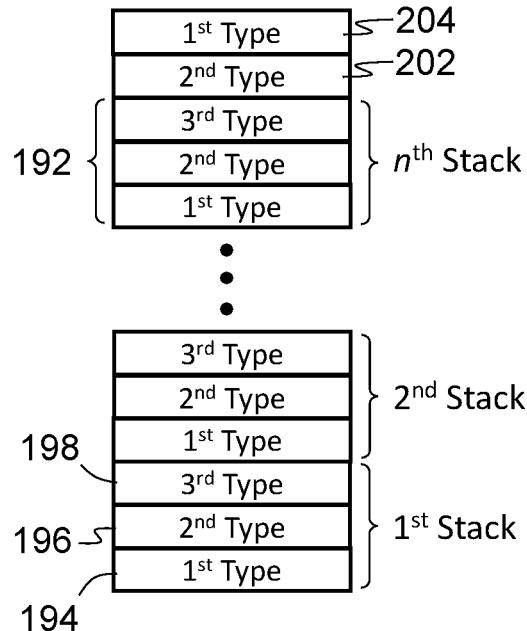
Figure 10H:
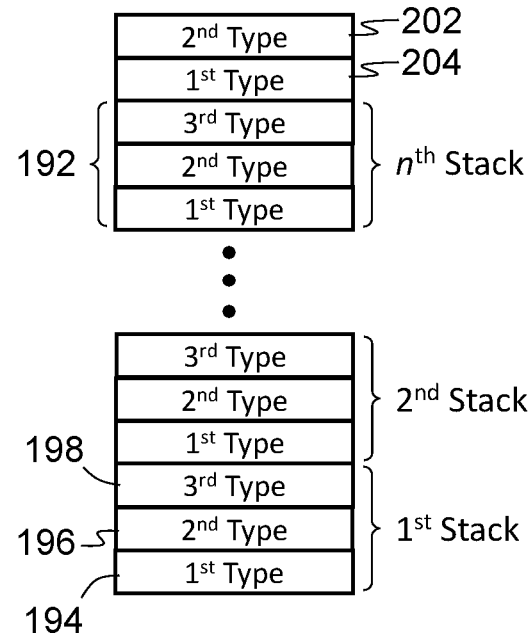
Figure 10G:
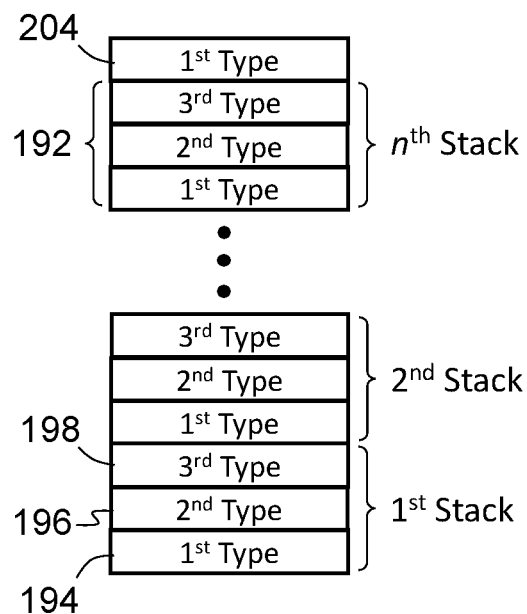
Figure 10I:
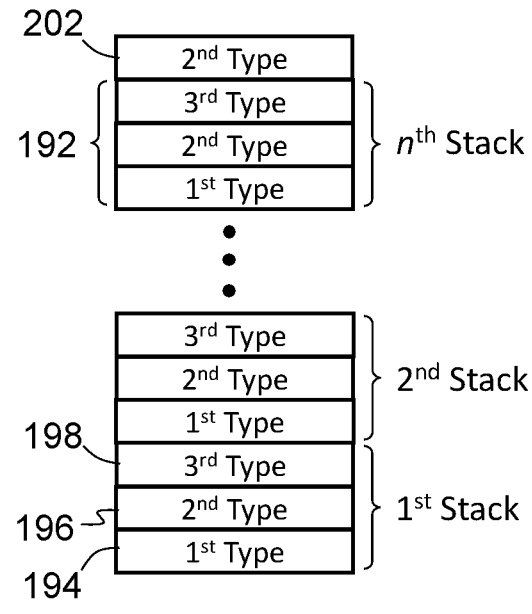

FIGS. 10F-10I show some exemplary structures in which one or more additional layers are formed adjacent to the $n^{th}$ stack. The exemplary structures of FIGS. 10G and 10I respectively show that a layer of the first type of material 204 and a layer of the second type of material 202 may form adjacent to the third type of material 198 of the $n^{th}$ stack. The exemplary structure of FIG. 10G may further include a layer of the second type of material 202 formed adjacent to the layer of the first type of material 204 opposite the $n^{th}$ stack as shown in FIG. 10H. Similarly, the exemplary structure of FIG. 10I may further include a layer of the first type of material 204 formed adjacent to the layer of the second type of material 202 opposite the $n^{th}$ stack as shown in FIG. 10F.

The multilayer structure of FIG. 10A is not limited to the exemplary structures of FIGS. 10B-10I and may be constructed from a combination of the exemplary structures of FIGS. 10B-10I. For example, the multilayered structure of FIG. 10A may have a layer of the third type of material 200 formed adjacent to the first stack and a layer of the first type of material 204 formed adjacent to the $n^{th}$ stack by combining the exemplary structures of FIGS. 10C and 10G. The layer of the first type of material 194 in a stack 192 may have a different thickness compared with other layers of the first type of material in other stacks. The layer of the second type of material 196 in a stack 192 may also have a different thickness compared with other layers of the second type of material in other stacks. Similarly, the layer of the third type of material 198 in a stack 192 may have a different thickness compared with other layers of the third type of material in other stacks. One or more layers of the three layers of materials 194-198 may be extremely thin and thus have fragmented coverage and/or are perforated with holes. The layer thicknesses of the first, second, and third types of materials 204, 202, and 200 at the periphery may or may not be same as the layer thicknesses of the first, second, and third types of materials 194, 196, and 198 of the trilayer unit structure 192, respectively. The stacking sequences of the exemplary multilayer structures of FIGS. 10A-10I may be inverted.

Each of the first type of material 194 and 204, the second type of material 196 and 202, and the third type of material 198 and 200 may be made of any suitable material, such as but not limited to Co, Ni, Fe, CoNi, CoFe, NiFe, CoNiFe, Pt, Pd, Ni, Ir, Cr, V, Ti, Zr, Hf, Nb, Ta, Mo, W, NiCr, NiV, NiTi, NiZr, NiHf, NiNb, NiTa, NiMo, NiW, or any combination thereof. Therefore, one or more of the magnetic layers 152-156, 160-166, 170-176, and 180 may include a multilayer structure, such as but not limited to [Co/Cr/Ni], [Co/Ni/Cr], [Co/Ir/Ni], [Co/Ni/Ir], [Ni/Co/Cr], [Ni/Cr/Co], [Ni/Co/Ir], [Ni/Ir/Co], [Co/V/Ni], [Co/Ni/V], [Ni/Co/V], [Ni/V/Co], [Co/Cr/Pt], [Co/Cr/Pd], [Co/Cr/Ir], [CoFe/Cr/Ni], [CoFe/Pd/Ni], [CoFe/V/Ni], [CoFe/Ir/Ni], [Co/NiCr/Ni], or any combination thereof. The multilayer structure may have a face-centered cubic (FCC) type of lattice structure, which is different from the body-centered cubic structure (BCC) of some ferromagnetic materials, such as Fe, CoFe, and CoFeB, and the halite-like cubic lattice structure of magnesium oxide (MgO) that may be used as the insulating tunnel junction layer 140. All individual magnetic layers of a magnetic multilayer structure may have the same magnetization direction. The multilayer structure may or may not exhibit the characteristic satellite peaks associated with superlattice when analyzed by X-ray, neutron diffraction, or other diffraction techniques.

Figure 11:
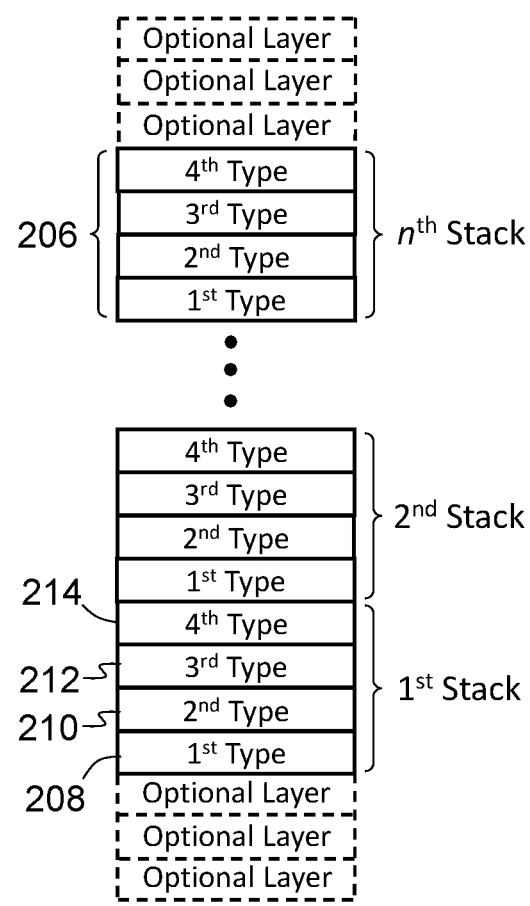
FIG. 11 is a cross-sectional view of an exemplary multilayer structure comprising one or more stacks of a quadlayer unit structure.

One or more of the magnetic layers 152-156, 160-166, 170-176, and 180 may alternatively have a multilayer structure formed by one (n=1) or more stacks of a quadlayer unit structure 206 as illustrated in FIG. 11. The quadlayer unit structure 206 includes a layer of a first type of material 208, a layer of a second type of material 210, a layer of a third type of material 212, and a layer of a fourth type of material 214 formed adjacent to each other. At least one of the four types of materials 208-214 is magnetic. One or more layers of the four layers of materials 208-214 may be extremely thin and thus have fragmented coverage and/or are perforated with holes. The multilayer structure of FIG. 11 may include one or more additional layers made of the first, second, third, and fourth types of materials formed adjacent to the first stack and/or the $n^{th}$ stack thereof. The stacking sequence of the multilayer structure of FIG. 11 may be inverted. All individual magnetic layers of the magnetic multilayer structure may have the same magnetization direction.

Each of the first, second, third, and fourth types of materials 208-214 may be made of any suitable material, such as but not limited to Co, Ni, Fe, CoNi, CoFe, NiFe, CoNiFe, Pt, Pd, Ni, Ir, Cr, V, Ti, Zr, Hf, Nb, Ta, Mo, W, NiCr, NiV, NiTi, NiZr, NiHf, NiNb, NiTa, NiMo, NiW, or any combination thereof. Moreover, two of the four types of materials 208-214 not in contact may have the same composition. For example, the first and third types of materials 208 and 212 or the second and fourth types of materials 210 and 214 may have the same composition. Therefore, one or more of the magnetic layers 152-156, 160-166, 170-176, and 180 may include a multilayer structure, such as but not limited to [Ni/Co/Ni/Cr], [Co/Ni/Co/Cr], [Co/Cr/Ni/Cr], [Ni/Co/Ni/Ir], [Co/Ni/Co/Ir], [Co/Ir/Ni/Ir], [Co/Ir/Ni/Cr], [Co/Ir/Co/Cr], or any combination thereof. The layer of each of the first, second, third, and fourth types of materials 208-214 in a stack 206 may have a different thickness compared with the layers of the same type of material in other stacks. The multilayer structure may or may not exhibit the characteristic satellite peaks associated with superlattice when analyzed by X-ray, neutron diffraction, or other diffraction techniques.

The insulating tunnel junction layer 140 of the MTJ structures 130 and 130' in FIGS. 5A and 5B, respectively, may be formed of a suitable insulating material containing oxygen, nitrogen, or both, such as but not limited to magnesium oxide ($MgO_x$), aluminum oxide ($AlO_x$), titanium oxide ($TiO_x$), zirconium oxide ($ZrO_x$), hafnium oxide ($HfO_x$), vanadium oxide ($VO_x$), tantalum oxide ($TaO_x$), chromium oxide ($CrO_x$), molybdenum oxide ($MoO_x$), tungsten oxide ($WO_x$), gallium oxide ($GaO_x$), silicon oxide ($SiO_x$), silicon nitride ($SiN_x$), $MgTiO_x$, $MgAlO_x$, $AlTiO_x$, or any combination thereof. The insulating tunnel junction layer 140 may have a composite structure comprising two layers of insulating materials, each of which is made of a suitable insulating material as described above. For example, the composite tunnel junction layer may include a layer of magnesium oxide and a layer of titanium oxide.

The anti-ferromagnetic coupling layer 142 of the MTJ structures 130 and 130' shown in FIGS. 5A and 5B, respectively, may be made of a suitable coupling material, such as but not limited to ruthenium (Ru), vanadium (V), niobium (Nb), tantalum (Ta), chromium (Cr), molybdenum (Mo), tungsten (W), manganese (Mn), rhenium (Re), osmium (Os), rhodium (Rh), iridium (Ir), copper (Cu), or any combination thereof. The anti-ferromagnetic coupling layer 142 may have a composite structure that includes two or more sublayers. Each of the sublayers may be made of a suitable coupling material described above.

The perpendicular enhancement layers (PELs) 158, 168, and 178 may comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C, thereby forming a suitable perpendicular enhancement material, such as but not limited to B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, $MgO_x$, $TiO_x$, $ZrO_x$, $HfO_x$, $VO_x$, $NbO_x$, $TaO_x$, $CrO_x$, $MoO_x$, $WO_x$, $RhO_x$, $NiO_x$, $PdO_x$, $PtO_x$, $CuO_x$, $AgO_x$, $RuO_x$, $SiO_x$, $TiN_x$, $ZrN_x$, $HfN_x$, $VN_x$, $NbN_x$, $TaN_x$, $CrN_x$, $MoN_x$, $WN_x$, $NiN_x$, $PdN_x$, $PtO_x$, $RuN_x$, $SiN_x$, $TiO_xN_y$, $ZrO_xN_y$, $HfO_xN_y$, $VO_xN_y$, $NbO_xN_y$, $TaO_xN_y$, $CrO_xN_y$, $MoO_xN_y$, $WO_xN_y$, $NiO_xN_y$, $PdO_xN_y$, $PtO_xN_y$, $RuO_xN_y$, $SiO_xN_y$, $TiRuO_x$, $ZrRuO_x$, $HfRuO_x$, $VRuO_x$, $NbRuO_x$, $TaRuO_x$, $CrRuO_x$, $MoRuO_x$, $WRuO_x$, $RhRuO_x$, $NiRuO_x$, $PdRuO_x$, $PtRuO_x$, $CuRuO_x$, $AgRuO_x$, CoFeB, CoFe, NiFe, CoFeNi, CoTi, CoZr, CoHf, CoV, CoNb, CoTa, CoFeTa, CoCr, CoMo, CoW, NiCr, NiTi, NiZr, NiHf, NiV, NiNb, NiTa, NiMo, NiW, CoNiTa, CoNiCr, CoNiTi, FeTi, FeZr, FeHf, FeV, FeNb, FeTa, FeCr, FeMo, FeW, or any combination thereof. In cases where the perpendicular enhancement material contains one or more ferromagnetic elements, such as Co, Fe, and Ni, the total content of the ferromagnetic elements of the perpendicular enhancement material may be less than the threshold required for becoming magnetic, thereby rendering the material essentially non-magnetic. Alternatively, the perpendicular enhancement material that contains one or more ferromagnetic elements may be very thin, thereby rendering the material superparamagnetic or magnetically dead. One or more of the PELs 158, 168, and 178 may have a multilayer structure comprising two or more layers of perpendicular enhancement sublayers, each of which is made of a suitable perpendicular enhancement material described above. For example and without limitation, one or more of the PELs 158, 168, and 178 may have a bilayer structure, such as but not limited to W/Ta, Ta/W, Mo/Ta, Ta/Mo, W/Hf, Hf/W, Mo/Hf, or Hf/Mo.

Figure 12A:
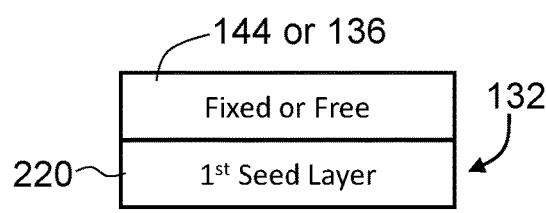
FIGS. 12A-12D are cross-sectional views of exemplary seed layer structures in accordance with embodiments of the present invention.
Figure 12B:
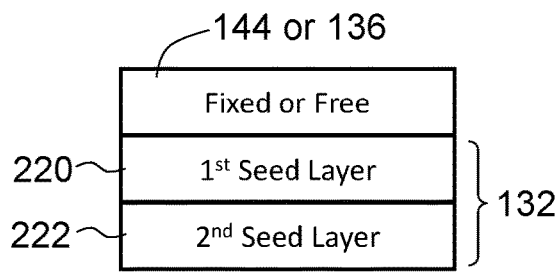
Figure 12C:
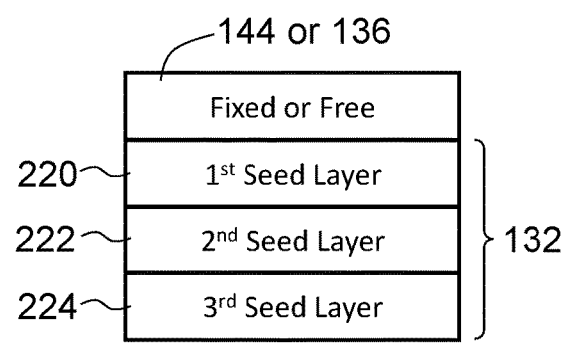
Figure 12D:
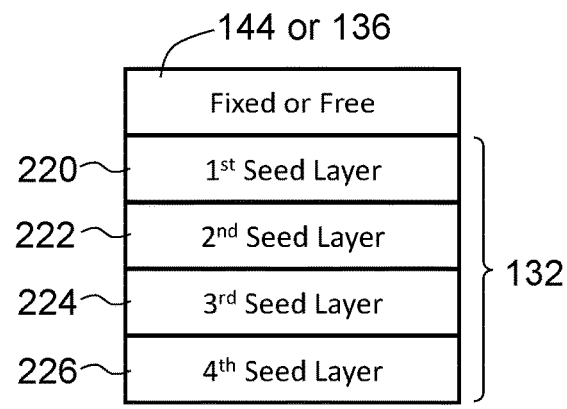

The seed layer structure 132 of the exemplary magnetic structures shown in FIGS. 5A and 5B, respectively, may include one or more seed layers as illustrated by the exemplary embodiments shown in FIGS. 12A-12D. FIG. 12A shows the seed layer structure 132 including a first seed layer 220 formed beneath the magnetic fixed layer structure 144 or the magnetic free layer structure 136. A second seed layer 222 may be formed adjacent to the first seed layer 220 opposite the magnetic fixed layer structure 144 or the magnetic free layer structure 136 as shown in FIG. 12B. Similarly, a third seed layer 224 may be formed adjacent to the second seed layer 222 opposite the first seed layer 220 as shown in FIG. 12C, and a fourth seed layer 226 may be formed adjacent to the third seed layer 224 opposite the second seed layer 222 as shown in FIG. 12D, and so forth. The seed layer structure 132 is not limited to the exemplary structures of FIGS. 12A-12D and may have additional seed layers not shown.

The first, second, third, and fourth seed layers 220-226 may be made of any suitable seed layer materials or structures. One or more of the seed layers 220-226 may comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C, thereby forming a suitable seed material such as one of those discussed above for the perpendicular enhancement material. For example and without limitation, one or more of the seed layers 220-226 may be made of $AlO_x$, $TiO_x$, MgO, CoFeB, CoCr, CoTa, CoTi, CoV, Ta, Ir, Hf, W, Mo, Ru, Pt, Pd, Ti, V, Cr, Zr, Nb, NiCr, NiTa, NiTi, NiV, or TaN. In an embodiment, the seed layer structure 132 has a bilayer structure (first seed layer 220/second seed layer 222), such as but not limited to NiTa/NiCr, NiCr/NiTa, NiTi/NiCr, NiCr/NiTi, NiTa/NiTi, NiTi/NiTa, NiV/NiCr, NiCr/NiV, Ta/Ru, Ru/Ta, Hf/Ta, Ta/Hf, W/Ta, Ta/W, W/Hf, Hf/W, Ta/Mo, Mo/Ta, Ta/TaN, TaN/Ta, Ta/TiN, TiN/Ta, Mo/Hf, Hf/Mo, W/Ru, Ru/W, Ir/Ta, Ta/Ir, Ir/W, W/Ir, Ir/Hf, Hf/Ir, Ir/Mo, Mo/Ir, Ir/Pt, Pt/Ir, Ir/Pd, Pd/Ir, MgO/Ta, Ta/MgO, MgO/Ru, Ru/MgO, MgO/Hf, Hf/MgO, MgO/W, W/MgO, MgO/Mo, Mo/MgO, MgO/Ti, Ti/MgO, MgO/V, V/MgO, MgO/Cr, Cr/MgO, MgO/Zr, Zr/MgO, MgO/Nb, Nb/MgO, MgO/Ir, Ir/MgO, Cr/CoFeB, Ir/CoFeB, Ru/CoFeB, V/CoFeB, Ti/CoFeB, Mo/CoFeB, W/CoFeB, Nb/CoFeB, Ta/CoFeB, Ti/CoFeB, Zr/CoFeB, Hf/CoFeB, Mg/CoFeB, or MgO/CoFeB. In another embodiment, the seed layer structure 132 has a trilayer structure (first seed layer 220/second seed layer 222/third seed layer 224), such as but not limited to MgO/CoFeB/Ru, MgO/CoFeB/Ta, MgO/CoFeB/W, MgO/CoFeB/Hf, MgO/Ru/Ta, MgO/Ru/TaN, Ta/Ru/TaN, Ru/Ta/TaN, Cr/CoFeB/Ta, Ir/CoFeB/Ta, Ru/CoFeB/Ta, V/CoFeB/Ta, Ti/CoFeB/Ta, Mo/CoFeB/Ta, W/CoFeB/Ta, Nb/CoFeB/Ta, Ta/CoFeB/Ta, Ti/CoFeB/Ta, Zr/CoFeB/Ta, Hf/CoFeB/Ta, Mg/CoFeB/Ta, Cr/CoFeB/Ru, Ir/CoFeB/Ru, Ru/CoFeB/Ru, V/CoFeB/Ru, Ti/CoFeB/Ru, Mo/CoFeB/Ru, W/CoFeB/Ru, Nb/CoFeB/Ru, Ta/CoFeB/Ru, Ti/CoFeB/Ru, Zr/CoFeB/Ru, Hf/CoFeB/Ru, or Mg/CoFeB/Ru. In still another embodiment, the seed layer structure 132 has a quadlayer structure (first seed layer 220/second seed layer 222/third seed layer 224/fourth seed layer 226), such as but not limited to MgO/CoFeB/Ru/Ta, MgO/CoFeB/Ta/Ru, MgO/CoFeB/Ta/W, MgO/CoFeB/W/Ta, MgO/CoFeB/Ru/W, MgO/CoFeB/W/Ru, MgO/CoFeB/Hf/Ta, MgO/CoFeB/Ta/Hf, MgO/CoFeB/Hf/W, MgO/CoFeB/W/Hf, MgO/CoFeB/Hf/Ru, MgO/CoFeB/Ru/Hf, MgO/CoFeB/Ta/TaN, MgO/CoFeB/Ru/TaN, Cr/CoFeB/Ru/Ta, Cr/CoFeB/Ta/Ru, Cr/CoFeB/Ta/W, Cr/CoFeB/W/Ta, Cr/CoFeB/Ru/W, Cr/CoFeB/W/Ru, Cr/CoFeB/Hf/Ta, Cr/CoFeB/Ta/Hf, Cr/CoFeB/Hf/W, Cr/CoFeB/W/Hf, Cr/CoFeB/Hf/Ru, Cr/CoFeB/Ru/Hf, Cr/CoFeB/Ta/TaN, Cr/CoFeB/Ru/TaN, Ir/CoFeB/Ru/Ta, Ir/CoFeB/Ta/Ru, Ir/CoFeB/Ta/W, Ir/CoFeB/W/Ta, Ir/CoFeB/Ru/W, Ir/CoFeB/W/Ru, Ir/CoFeB/Hf/Ta, Ir/CoFeB/Ta/Hf, Ir/CoFeB/Hf/W, Ir/CoFeB/W/Hf, Ir/CoFeB/Hf/Ru, Ir/CoFeB/Ru/Hf, Ir/CoFeB/Ta/TaN, or Ir/CoFeB/Ru/TaN. A seed layer that includes one or more ferromagnetic elements may be non-magnetic if the total content of the ferromagnetic elements is less than the threshold required for becoming magnetic or if the layer thickness decreases to a point that the supposedly ferromagnetic material becomes superparamagnetic. For example and without limitation, the CoFeB layer in the seed layer structure may be non-magnetic or superparamagnetic. In an embodiment, one or more of the seed layers 220-226 may have a noncrystalline or amorphous structure. For example and without limitation, the CoFeB layer and the Ta layer in the seed layer structure may have a noncrystalline structure.

Figure 13A:
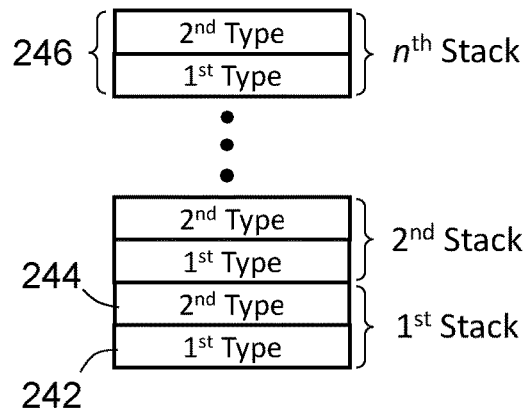
FIGS. 13A-13D are cross-sectional views of exemplary multilayer structures comprising one or more stacks of a bilayer unit structure for the seed layer.
Figure 13C:
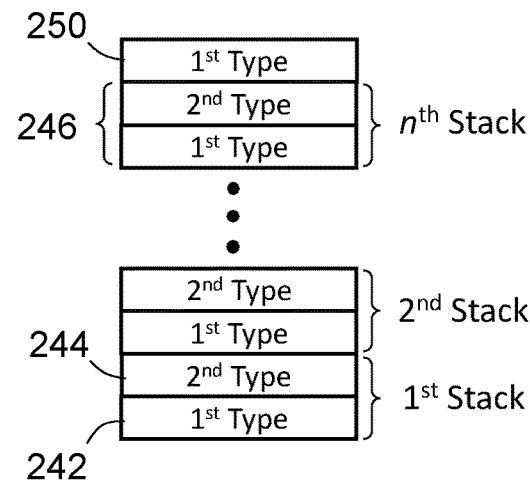
Figure 13B:
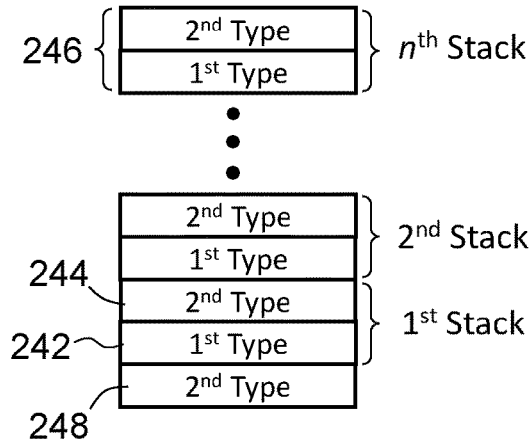
Figure 13D:
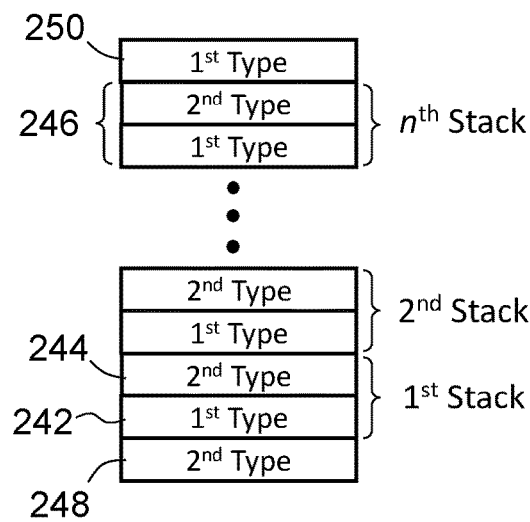

Alternatively, one or more of the seed layers 220-226 may have a multilayer structure formed by interleaving one or more layers of a first type of seed material 242 with one or more layers of a second type of seed material 244 as illustrated in FIGS. 13A-13D. FIG. 13A shows an exemplary multilayer seed structure formed by one (n=1) or more stacks of a bilayer unit structure 246, which includes a layer of the first type of seed material 242 and a layer of the second type of seed material 244. The multilayer seed structure may include additional layers formed at the periphery of the exemplary multilayer structure of FIG. 13A. For example and without limitation, the stacks of the bilayer unit structure 246 may include another layer of the second type of seed material 248 formed adjacent to the first type of seed material 242 of the first stack as shown in FIG. 13B, or another layer of the first type of seed material 250 formed adjacent to the second type of seed material 244 of the $n^{th}$ stack (the end stack) as shown in FIG. 13C, or both as shown in FIG. 13D. The layer of the first type of seed material 242 in a stack 246 may have a different thickness compared with other layers of the first type of seed material in other stacks. Similarly, the layer of the second type of seed material 244 in a stack 246 may have a different thickness compared with other layers of the second type of seed material in other stacks. The layer thicknesses of the first type of seed material 250 and the second type of seed material 248 at the periphery may or may not be same as the layer thicknesses of the first type of seed material 242 and the second type of seed material 244 of the bilayer unit structure 246, respectively. One or more layers of the two types of seed materials 242, 244, 248, and 250 may be extremely thin and thus have fragmented coverage and/or are perforated with holes. The stacking sequences of the exemplary multilayer structures of FIGS. 13A-13D may be inverted.

The first type of seed material 242 and 250 may comprise one or more of the following non-magnetic elements: B, Mg, Ti, Zr, Hf, V, Nb, Ta, Cr, Mo, W, Mn, Re, Ru, Os, Rh, Ir, Pd, Pt, Cu, Ag, Au, Al, Si, Ge, Ga, O, N, and C, to form a suitable seed material, such as but not limited to MgO, Ta, Ir, Hf, W, Mo, Ru, Pt, Pd, Ti, Zr, V, Nb, Cr, TiN, and TaN.

Alternatively, the first type of seed material 242 and 250 may comprise one or more ferromagnetic elements, such as but not limited to cobalt (Co), nickel (Ni), and iron (Fe), to form a material, such as but not limited to Co, Ni, Fe, CoNi, CoFe, NiFe, CoNiFe. The first type of seed material 242 and 250 containing ferromagnetic elements may further include at least one non-magnetic element, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), and phosphorus (P), to form an alloy or compound, such as but not limited to nickel-chromium (NiCr), nickel-titanium (NiTi), nickel-tantalum (NiTa), nickel-vanadium (NiV), nickel-zirconium (NiZr), cobalt-chromium (CoCr), cobalt-titanium (CoTi), cobalt-tantalum (CoTa), cobalt-vanadium (CoV), cobalt-iron-boron (CoFeB), cobalt-iron-boron-titanium (CoFeBTi), cobalt-iron-boron-zirconium, (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), iron-zirconium-boron (FeZrB) or cobalt-iron-phosphorous (CoFeP). The first type of seed material 242 and 250 may be non-magnetic if the content of the magnetic elements is below the threshold required for becoming magnetized.

The first type of seed material 242 and 250 may have a layer thickness of at least about 0.1 nm, preferably about 0.2 to 3.0 nm, more preferably about 0.2 nm to 2.5 nm. Accordingly, in embodiments where the first type of seed material 242 and 250 includes therein ferromagnetic elements, the first type of seed material 242 and 250 may become non-magnetic or behave like a magnetic dead layer when the thickness decreases to a point that the supposedly ferromagnetic material becomes superparamagnetic.

The second type of seed material 244 and 248 may be made of any suitable material for the first type of seed material 242 and 250 as described above and may have the same thickness ranges as the first type of seed material 242 and 250 as described above. For example and without limitation, the bilayer unit structure 246 (first type/second type) may be Ni/Ta, Ni/Ti, Ni/Cr, Ni/V, Ni/Zr, Ni/Hf, Ni/V, Ni/Nb, Ni/Mo, Ni/W, NiCr/Ta, NiCr/Ti, NiCr/V, NiCr/Nb, NiCr/Cr, Co/Ta, Co/Ti, Co/Cr, Co/V, Co/Zr, Co/Hf, Co/V, Co/Nb, Co/Mo, Co/W CoFeB/Ta, CoFeB/Ru, Ru/CoFeB, CoFeB/FeZrB, FeZrB/CoFeB, FeZrB/Ta, Ta/FeZrB, Ni/Ir, NiCr/Ir, Ir/Ta, Ir/Cr, Co/Ir, or CoFeB/Ir, MgO/Ta, MgO/Ru, MgO/Cr, MgO/Ti, MgO/Hf, MgO/Mo, MgO/Ir, Ir/Mo, Ir/W, Ir/Hf, Ir/Zr, Ir/Ti, Ir/Nb, Ir/V, Ir/Ru, MgO/Pt, MgO/Pd, Pt/Ta, Pt/Ti, Pt/Cr, Pt/V, Pt/Zr, Pt/Hf, Pt/V, Pt/Nb, Pt/Mo, Pt/W, Pd/Ta, Pd/Ti, Pd/Cr, Pd/V, Pd/Zr, Pd/Hf, Pd/V, Pd/Nb, Pd/Mo, or Pd/W. In an embodiment, one or both of the first and second types of seed materials 242, 244, 248, and 250 are amorphous or noncrystalline.

One or more of the seed layers 220-226 of the seed layer structure 132 shown in FIGS. 5A and 5B may therefore have a multilayer structure formed by interleaving one or more layers of a first type of seed material 242 with one or more layers of a second type of seed material 244. For example and without limitation, the seed layer structure 132 may have a structure illustrated in FIG. 12B that includes the second seed layer 222 made of NiCr or CoCr and the first seed layer 220 formed by interleaving one or more layers of Ni with one or more layers of Ta. The stacking of [Ni/Ta] multilayer structure may begin with a Ni or Ta layer and end with a Ni or Ta layer.

Figure 14A:
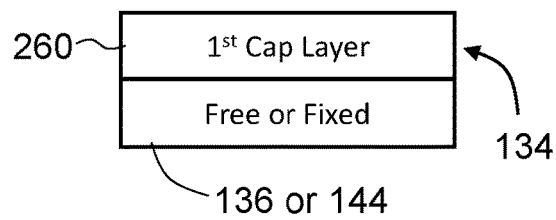
FIGS. 14A-14D are cross-sectional views of exemplary cap layer structures in accordance with embodiments of the present invention.
Figure 14C:
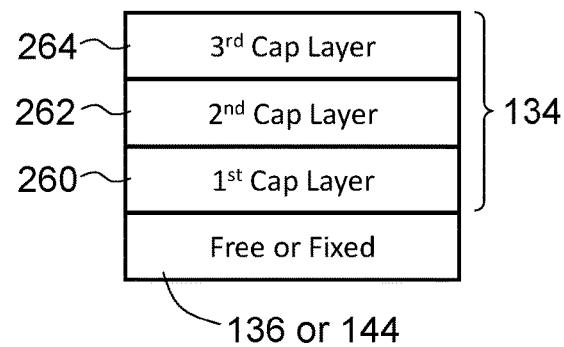
Figure 14B:
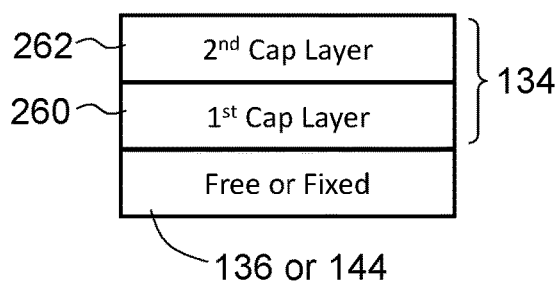
Figure 14D:
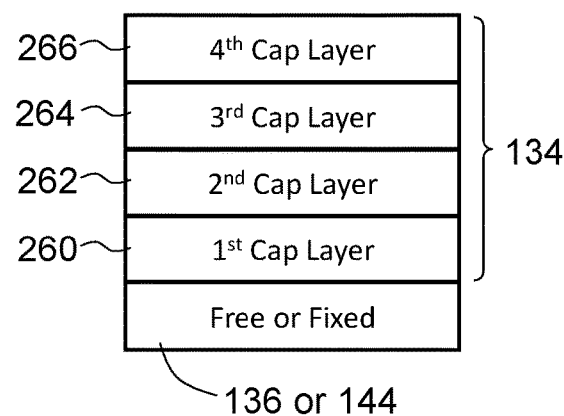

The cap layer structure 134 of the exemplary magnetic structures shown in FIGS. 5A and 5B, respectively, may include one or more cap layers as illustrated by the exemplary embodiments shown in FIGS. 14A-14D. FIG. 14A shows the cap layer structure 134 including a first cap layer 260 formed above the magnetic fixed layer structure 144 or the magnetic free layer structure 136. A second cap layer 262 may be formed adjacent to the first cap layer 260 opposite the magnetic fixed layer structure 144 or the magnetic free layer structure 136 as shown in FIG. 14B. Similarly, a third cap layer 264 may be formed adjacent to the second cap layer 262 opposite the first cap layer 260 as shown in FIG. 14C, and a fourth cap layer 266 may be formed adjacent to the third cap layer 264 opposite the second cap layer 262 as shown in FIG. 14D, and so forth. The cap layer structure 134 is not limited to the exemplary structures of FIGS. 14A-14D and may have additional cap layers not shown.

The first, second, third, and fourth cap layers 260-266 may be made of any suitable cap layer materials or structures. One or more of the cap layers 260-266 may comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C, thereby forming a suitable cap material such as one of those discussed above for the perpendicular enhancement material. For example and without limitation, one or more of the cap layers 260-266 may be made of $AlO_x$, $TiO_x$, MgO, CoFeB, CoCr, CoTa, CoTi, CoV, Ta, Ir, Hf, W, Mo, Ru, Pt, Pd, Ti, V, Cr, Zr, Nb, NiCr, NiTa, NiTi, NiV, or TaN. In an embodiment, the cap layer structure 134 has a bilayer structure (first cap layer 260/second cap layer 262), such as but not limited to NiTa/NiCr, NiCr/NiTa, NiTi/NiCr, NiCr/NiTi, NiTa/NiTi, NiTi/NiTa, NiV/NiCr, NiCr/NiV, Ta/Ru, Ru/Ta, Hf/Ta, Ta/Hf, W/Ta, Ta/W, W/Hf, Hf/W, Ta/Mo, Mo/Ta, Ta/TaN, TaN/Ta, Ta/TiN, TiN/Ta, Mo/Hf, Hf/Mo, W/Ru, Ru/W, Ir/Ta, Ta/Ir, Ir/W, W/Ir, Ir/Hf, Hf/Ir, Ir/Mo, Mo/Ir, Ir/Pt, Pt/Ir, Ir/Pd, Pd/Ir, MgO/Ta, Ta/MgO, MgO/Ru, Ru/MgO, MgO/Hf, Hf/MgO, MgO/W, W/MgO, MgO/Mo, Mo/MgO, MgO/Ti, Ti/MgO, MgO/V, V/MgO, MgO/Cr, Cr/MgO, MgO/Zr, Zr/MgO, MgO/Nb, Nb/MgO, MgO/Ir, Ir/MgO, or MgO/CoFeB. The CoFeB layer in the cap layer structure 134 may be non-magnetic or superparamagnetic.

Additional cap layers may further form adjacent to the exemplary MgO/CoFeB cap layer structure to form trilayer cap layer structures (first cap layer 260/second cap layer 262/third cap layer 264), such as but not limited to MgO/CoFeB/Ru, MgO/CoFeB/Ta, MgO/CoFeB/W, MgO/CoFeB/Hf, MgO/CoFeB/Mo, Mo/MgO/CoFeB, W/MgO/CoFeB, Ta/MgO/CoFeB, Hf/MgO/CoFeB, and Ir/MgO/CoFeB. Other examples of the trilayer structure includes MgO/Ru/Ta, MgO/Ru/TaN, Ta/Ru/TaN, Ru/Ta/TaN, Ir/Ta/MgO, Ir/Mo/MgO, Ir/W/MgO, Ir/Hf/MgO, Ir/Ru/MgO and Ir/MgO/Ru.

In another embodiment, the cap layer structure 134 has a quadlayer structure (first cap layer 260/second cap layer 262/third cap layer 264/fourth cap layer 266), such as but not limited to MgO/CoFeB/Ru/Ta, MgO/CoFeB/Ta/Ru, MgO/CoFeB/Ta/W, MgO/CoFeB/W/Ta, MgO/CoFeB/Ru/W, MgO/CoFeB/W/Ru, MgO/CoFeB/Hf/Ta, MgO/CoFeB/Ta/ Hf, MgO/CoFeB/Hf/W, MgO/CoFeB/W/Hf, MgO/CoFeB/ Hf/Ru, MgO/CoFeB/Ru/Hf, MgO/CoFeB/Ta/TaN, MgO/ CoFeB/Ru/TaN, Mo/MgO/CoFeB/Ta, W/MgO/CoFeB/Ta, Ta/MgO/CoFeB/Ta, Ir/MgO/CoFeB/Ta, or Hf/MgO/CoFeB/ Ta.

A cap layer that includes one or more ferromagnetic elements may be non-magnetic if the total content of the ferromagnetic elements is less than the threshold required for becoming magnetic or if the layer thickness decreases to a point that the supposedly ferromagnetic material becomes superparamagnetic. In an embodiment, one or more of the cap layers 260-266 may have a noncrystalline or amorphous structure.

Figure 15:
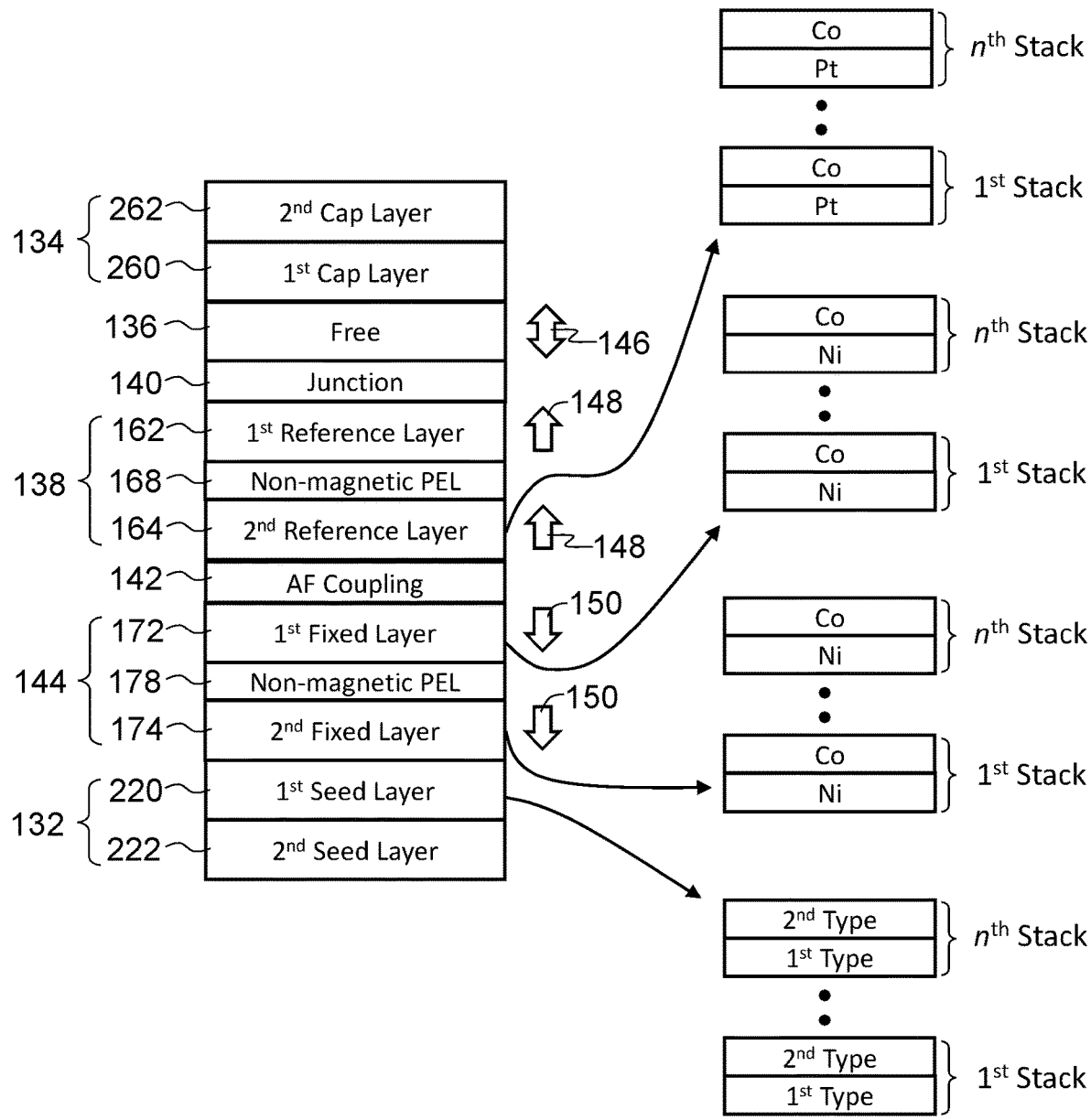
FIG. 15 is a cross-sectional view of an exemplary structure for an MTJ memory element in accordance with an embodiment of the present invention.

FIG. 15 shows an exemplary magnetic structure corresponding to the exemplary embodiment of FIG. 5A. The exemplary structure of FIG. 15 includes the seed layer structure 132 and the magnetic fixed layer structure 144 formed thereon. The magnetic reference layer structure 138 is anti-ferromagnetically coupled to the magnetic fixed layer structure 144 via the anti-ferromagnetic coupling layer 142. The magnetic free layer structure 136 is separated from the magnetic reference layer structure 138 by the insulating tunnel junction layer 140. The cap layer structure 134 is formed on top of the magnetic free layer structure 136.

With continuing reference to FIG. 15, the seed layer structure 132 may include the second seed layer 222 made of NiCr alloy or compound and the first seed layer 220 formed by interleaving one or more layers of Ni with one or more layers of Ta on top of the second seed layer 222. The second seed layer 222 may alternatively be made of NiTa, NiTi, NiV, CoCr, CoTa, CoTi, or CoV. Despite incorporating a ferromagnetic element (Ni or Co) therein, the second seed layer 222 may be non-magnetic. The first seed layer 220 may alternatively be formed by interleaving one or more layers of Ni or Co with one or more layers of Ti, Ta, or V. Similarly, the first seed layer 220 may be non-magnetic despite inclusion of one or more Ni or Co layers.

The magnetic fixed layer structure 144 formed on top of the first seed layer 220 may include multiple layers of Co interleaved with multiple layers of Ni or Pt. The magnetic fixed layer structure 144 may alternatively include the first and second magnetic fixed layers 172 and 174 with the PEL 178 interposed therebetween. The first and second magnetic fixed layers 172 and 174 may each include one or more layers of Co interleaved with one or more layers of Ni, and the PEL 178 may be made of Cr.

The anti-ferromagnetic coupling layer 142 formed on top of the magnetic fixed layer structure 144 may be made of Ru, Ir, or any combination thereof. The magnetic reference layer structure 138 formed on top of the anti-ferromagnetic coupling layer 142 includes the first and second magnetic reference layers 162 and 164 with the PEL 168 interposed therebetween. The second magnetic reference layer 164 formed adjacent to the anti-ferromagnetic coupling layer 142 may include one or more layers of Co interleaved with one or more layers of Pt or Ni. The PEL 168 may be made of Ta, Mo, W, Hf, or any combination thereof. The first magnetic reference layer 162 may comprise Co, Fe, and B. The insulating tunnel junction layer 140 formed on top of the first magnetic reference layer 162 may be made of magnesium oxide, aluminum oxide, titanium oxide, or any combination thereof. The magnetic free layer structure 136 formed on top of the insulating tunnel junction layer 140 may comprise Co, Fe, and B. Alternatively, the magnetic free layer structure 136 may include two CoFeB layers with a Mo or W PEL interposed therebetween. The cap layer structure 134 includes the first cap layer 240 formed on top of the magnetic free layer structure 136 and the second cap layer 242 formed on top of the first cap layer 240. The first and second cap layers 260 and 262 may be made of MgO and CoFeB, respectively. In an embodiment, the CoFeB cap layer is non-magnetic or superparamagnetic.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A magnetic structure comprising:
 a seed layer structure including:
  a first seed layer comprising tantalum;
  a second seed layer formed on top of said first seed layer and comprising iridium;
  a third seed layer formed on top of said second seed layer and comprising iron; and
  a fourth seed layer formed on top of said third seed layer and comprising chromium; and
 a magnetic fixed layer structure formed on top of said seed layer structure and having a first invariable magnetization direction substantially perpendicular to a layer plane of said magnetic fixed layer structure, said magnetic fixed layer structure including layers of a magnetic material interleaved with layers of a transition metal.

2. The magnetic structure of claim 1, wherein said transition metal comprises nickel.

3. The magnetic structure of claim 1, wherein said transition metal comprises iridium.

4. The magnetic structure of claim 1, wherein said transition metal comprises platinum.

5. The magnetic structure of claim 1, wherein said transition metal comprises palladium.

6. The magnetic structure of claim 1, wherein said magnetic material comprises cobalt.

7. The magnetic structure of claim 1, wherein said third seed layer further comprises nickel.

8. The magnetic structure of claim 7, wherein said third seed layer further comprises boron.

9. The magnetic structure of claim 7, wherein said third seed layer further comprises chromium.

10. The magnetic structure of claim 1, wherein said third seed layer further comprises cobalt.

11. The magnetic structure of claim 10, wherein said third seed layer further comprises tantalum.

12. The magnetic structure of claim 10, wherein said third seed layer further comprises tungsten.

13. The magnetic structure of claim 10, wherein said third seed layer further comprises molybdenum.

14. The magnetic structure of claim 10, wherein said third seed layer further comprises boron.

15. The magnetic structure of claim 14, wherein said third seed layer further comprises one of tantalum, tungsten, or molybdenum.

16. The magnetic structure of claim 1 further comprising:
 an anti-ferromagnetic coupling layer formed adjacent to said magnetic fixed layer structure opposite said seed layer structure; and a magnetic reference layer structure formed adjacent to said anti-ferromagnetic coupling layer opposite said magnetic fixed layer structure, said magnetic reference layer structure including:
  first and second magnetic reference layers having a second invariable magnetization direction that is substantially perpendicular to layer planes thereof and is substantially opposite to said first invariable magnetization direction; and
  a first non-magnetic perpendicular enhancement layer interposed between said first and second magnetic reference layers.

17. The magnetic structure of claim 16, wherein said second magnetic reference layer is formed adjacent to said anti-ferromagnetic coupling layer and comprises cobalt.

18. The magnetic structure of claim 16, wherein said anti-ferromagnetic coupling layer comprises iridium.

19. The magnetic structure of claim 16 further comprising:
  an insulating tunnel junction layer formed adjacent to said first magnetic reference layer opposite said first non-magnetic perpendicular enhancement layer; and
  a magnetic free layer structure formed adjacent to said insulating tunnel junction layer opposite said first magnetic reference layer, said magnetic free layer structure including one or more magnetic free layers having a variable magnetization direction substantially perpendicular to layer planes thereof.

20. The magnetic structure of claim 19, wherein said magnetic free layer structure includes first and second magnetic free layers and a second non-magnetic perpendicular enhancement layer interposed therebetween.

\* \* \* \* \*